United States Patent
Yoon et al.

(10) Patent No.: US 7,977,725 B2
(45) Date of Patent: Jul. 12, 2011

(54) INTEGRATED CIRCUIT SEMICONDUCTOR DEVICE INCLUDING STACKED LEVEL TRANSISTORS

(75) Inventors: Jae-man Yoon, Gyeonggi-do (KR); Yong-chul Oh, Gyeonggi-do (KR); Hui-jung Kim, Seoul (KR); Hyun-woo Chung, Seoul (KR); Kang-uk Kim, Seoul (KR); Dong-gun Park, Seoul (KR); Woun-suck Yang, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 392 days.

(21) Appl. No.: 12/171,091

(22) Filed: Jul. 10, 2008

(65) Prior Publication Data
US 2009/0108318 A1    Apr. 30, 2009

(30) Foreign Application Priority Data
Oct. 24, 2007  (KR) .................. 10-2007-0107417

(51) Int. Cl.
*H01L 27/108*    (2006.01)
*H01L 29/76*     (2006.01)
*H01L 29/94*     (2006.01)
*H01L 31/119*    (2006.01)

(52) U.S. Cl. .......... 257/306; 257/296; 257/302
(58) Field of Classification Search .......... 257/296, 257/300, 302, 303, 306, 308
See application file for complete search history.

(56) References Cited

U.S. PATENT DOCUMENTS
| 7,179,737 | B2* | 2/2007 | Nishida et al. | 438/649 |
| 2005/0059214 | A1* | 3/2005 | Cheng et al. | 438/270 |
| 2007/0228434 | A1* | 10/2007 | Shimojo | 257/296 |
| 2008/0283816 | A1* | 11/2008 | Takaishi | 257/4 |

FOREIGN PATENT DOCUMENTS
| JP | 05-102430 | 4/1993 |
| KR | 1020020010813 A | 6/2002 |
| KR | 1020060104696 A | 9/2006 |

* cited by examiner

*Primary Examiner* — Phuc T Dang
(74) *Attorney, Agent, or Firm* — Myers Bigel Sibley & Sajovec

(57) ABSTRACT

An integrated circuit semiconductor device includes a first transistor formed at a lower substrate and configured with at least one of a vertical transistor and a planar transistor. A bonding insulation layer is formed on the first transistor, and an upper substrate is bonded on the bonding insulation layer. A second transistor configured with at least one of a vertical transistor and a planar transistor is formed at the upper substrate. The first transistor and the second transistor are connected by an interconnection layer.

17 Claims, 34 Drawing Sheets

INTEGRATED CIRCUIT SEMICONDUCTOR DEVICE INCLUDING STACKED LEVEL TRANSISTORS

REFERENCE TO PRIORITY APPLICATION

This application claims priority from Korean Patent Application No. 10-2007-0107417, filed Oct. 24, 2007, the disclosure of which is hereby incorporated herein by reference.

FIELD OF THE INVENTION

The present invention relates to integrated circuit devices and methods of forming same and, more particularly, to vertically integrated circuits and methods of forming same.

BACKGROUND OF THE INVENTION

An increase in integration density of an integrated circuit semiconductor device (semiconductor chip) is drastically decreasing the design rule in order to integrate more transistors in a limited substrate area. As a result, an area and length of a transistor in a cell area (hereinafter, referred to as a cell array transistor) of the integrated semiconductor device such as a dynamic random access memory (DRAM) device are greatly decreasing.

The decrease in the design rule of the integrated circuit semiconductor device results in a short-channel effect and deterioration of current driving capability of the cell array transistor. It is necessary to overcome such limitations of the cell array transistor of the integrated circuit semiconductor device. Also, a peripheral circuit region is required to drive the cell array transistor of the integrated circuit semiconductor device. Examples of the peripheral circuit region may include a sense amplifier region, a word line driver region and a support circuit region. A peripheral circuit transistor is formed in the peripheral circuit region. The peripheral circuit transistor also needs to have improved integration density because of the decrease of the design rule in the integrated circuit semiconductor device.

When the cell array transistor or the peripheral circuit transistor is implemented on a substrate, there is a need to fabricate the integrated circuit semiconductor device with improved integration density through a simple process.

SUMMARY OF THE INVENTION

The present invention provides an integrated circuit semiconductor device in which a cell array transistor or a peripheral circuit transistor is configured with a vertical transistor to improve integration density, or which includes stacked vertical or planar transistors to improve the integration density.

The present invention also provides a fabrication method of an integrated circuit semiconductor device, which can achieve simplicity in fabrication when vertical or planar transistors are stacked to form a cell array transistor or a peripheral transistor on a substrate.

According to an aspect of the present invention, there is provided an integrated circuit semiconductor device including: a first transistor formed at a lower substrate, which includes at least one of a vertical transistor and a planar transistor; a bonding insulation layer provided on the first transistor; a second transistor formed at an upper substrate bonded with the bonding insulation layer, and comprising at least one of a vertical transistor and a planar transistor; and an interconnection layer connecting the first transistor and the second transistor together.

The vertical transistor of the first transistor or the second transistor may be comprised of a first gate structure surrounding a side surface of a first active pattern provided at the lower substrate or the upper substrate and first impurity regions provided in a surface portion of the first active pattern and under the first gate structure.

The planar transistor of the first transistor or the second transistor may be comprised of a second gate structure provided on a second active pattern provided at the lower substrate or the upper substrate and second impurity regions provided in a surface portion of the second active pattern exposed by the second gate structure.

According to another aspect of the present invention, there is provided an integrated circuit semiconductor comprising: a vertical transistor comprising a first gate structure surrounding a side surface of a first active pattern provided at a lower substrate, and first impurity regions provided in a surface portion of the first active pattern and under the first gate structure; a bonding insulation layer provided on the vertical transistor; a planar transistor comprising a second gate structure provided on a second active pattern provided at an upper substrate bonded with the bonding insulation layer, and second impurity regions provided in a surface portion of the second active pattern exposed by the second gate structure; and an interconnection layer connecting the vertical transistor and the planar transistor together.

According to another aspect of the present invention, there is provided an integrated circuit semiconductor device comprising: a planar transistor comprising a first gate structure provided on a first active pattern provided at a lower substrate, and first impurity regions provided in a surface portion of the first active pattern exposed by the first gate structure; a bonding insulation layer provided on the planar transistor; a vertical transistor comprising a second gate structure surrounding a side surface of a second active pattern provided at an upper substrate bonded with the bonding insulation layer, and second impurity regions provided in a surface portion of the second active pattern and under the second gate structure; and an interconnection layer connecting the planar transistor and the vertical transistor together.

According to another aspect of the present invention, there is provided a fabrication method of an integrated circuit semiconductor device, the method comprising: forming a first transistor at a lower substrate, the first transistor being configured with at least one of a vertical transistor and a planar transistor; forming a bonding insulation layer on the first transistor; bonding an upper substrate on the bonding insulation layer; forming a second transistor at the upper substrate, the second transistor being configured with at least one of a vertical transistor and a planar transistor; and forming an interconnection layer connecting the first transistor and the second transistor together.

The configuring of the first transistor or the second transistor with the vertical transistor may be comprised of etching the lower substrate or the upper substrate to form a first active pattern and forming a first gate structure surrounding a side surface of the first active pattern, and first impurity regions in a surface portion of the first active pattern and under the first gate structure.

The configuring of the first transistor or the second transistor with the planar transistor may be comprised of etching the lower substrate or the upper substrate to form a second active pattern and forming a gate structure on the second active pattern, and second impurity regions in a surface portion of the second active pattern exposed by the second gate structure.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
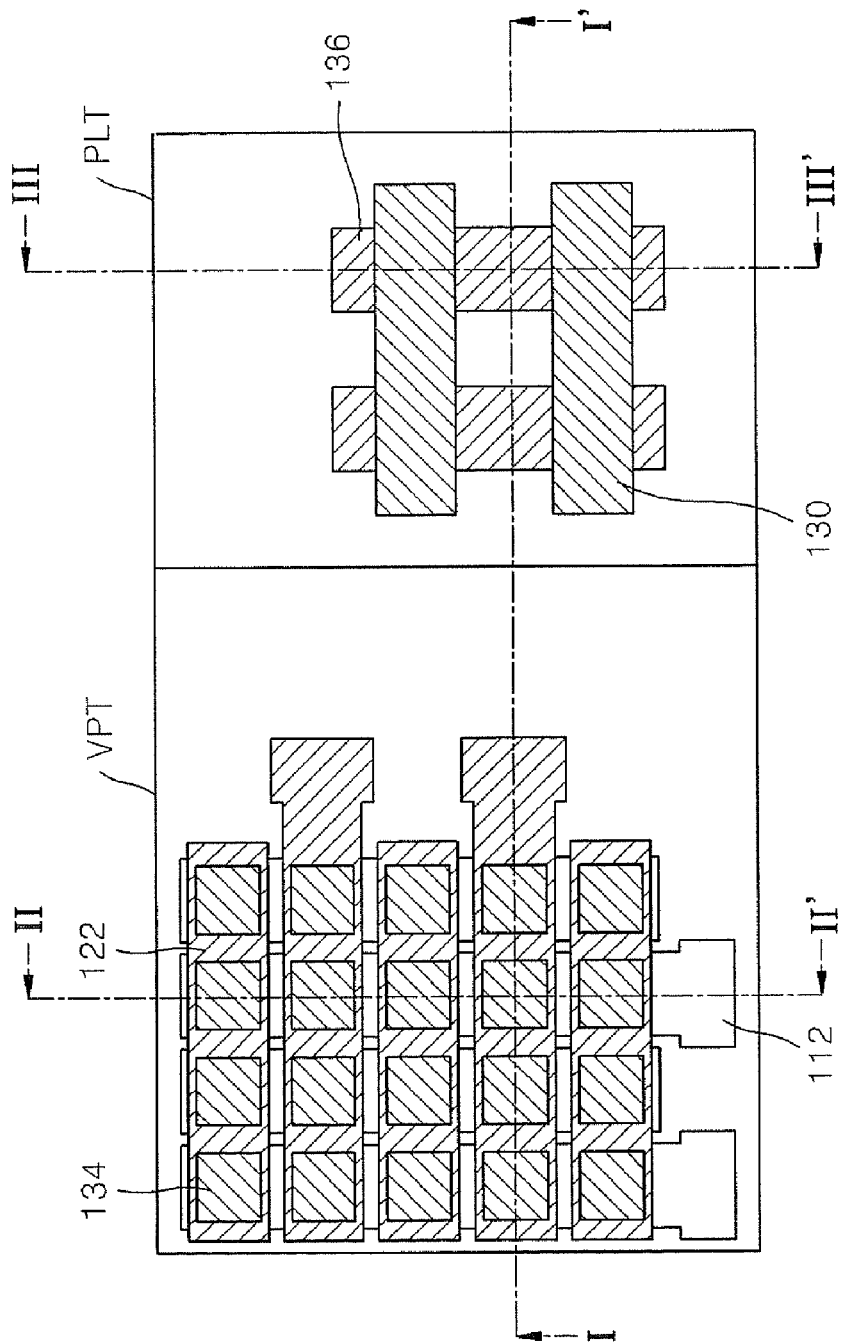
FIG. 1 is a plan view for explaining an integrated circuit semiconductor device according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the dimensions of substrates, layers, regions or patterns are exaggerated for clarity. It will also be understood that when a layer, a region, a pad or a pattern is referred to as being "on" another substrate, layer region or pad, it can be directly on the other layer, region, pad or pattern, or intervening layers, regions, pads or patterns may also be present.

Also, though terms like a first and a second are used to describe various members, components, regions, layers, and/or portions in various embodiments of the present invention, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment. Like reference numerals in the drawings denote like elements, and thus their description is omitted. Each member may be understood as any one concept of singularity and plurality.

Figure 6:
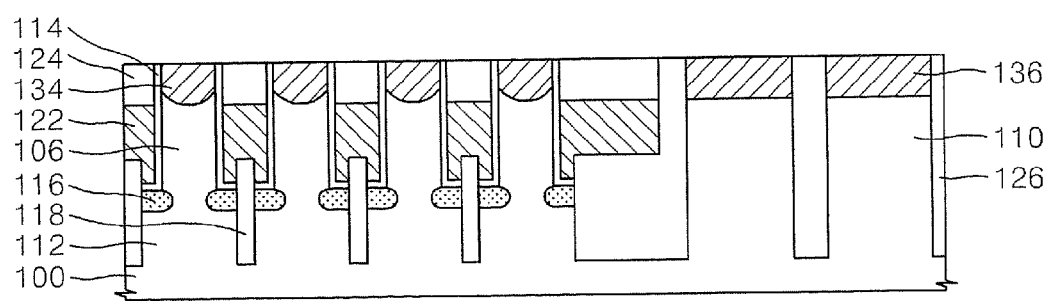
FIGS. 6, 17 and 28 are cross-sectional views taken along lines I-I', II-II' and III-III' of FIG. 1, respectively.
Figure 17:
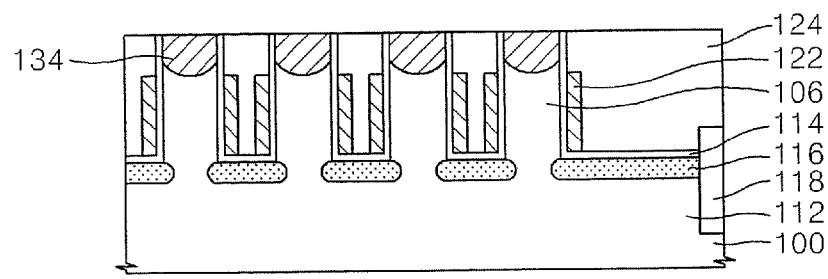
Figure 28:
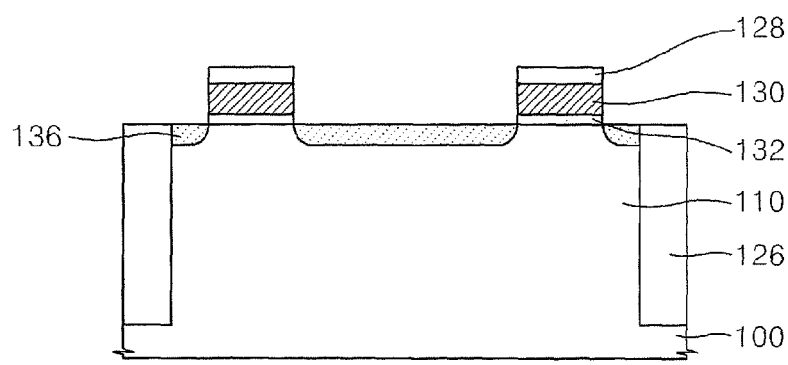
Figure 34:
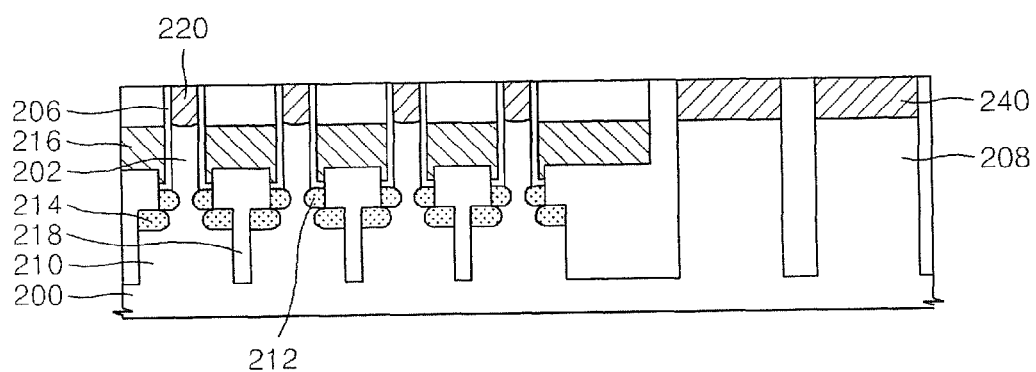
FIGS. 34 and 35 are cross-sectional views for explaining an integrated circuit semiconductor device according to another embodiment of the present invention.
Figure 35:
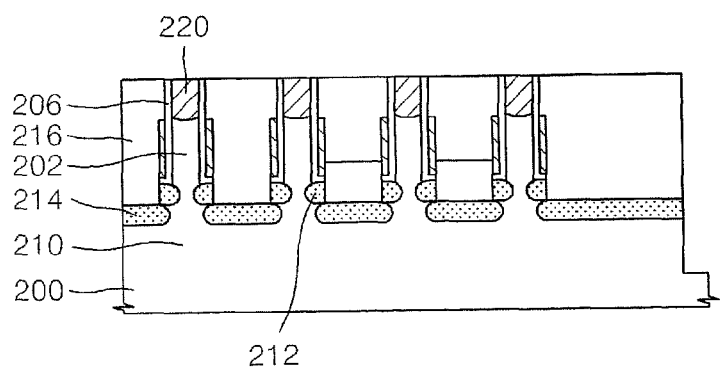
Figure 36:
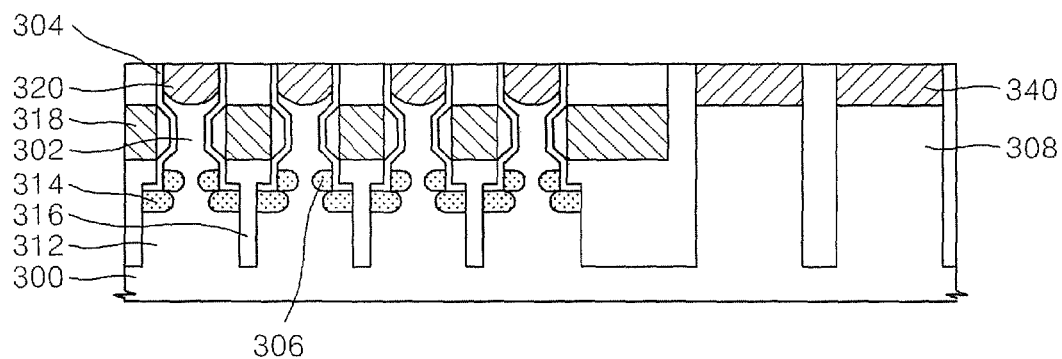
FIGS. 36 and 37 are cross-sectional views for explaining an integrated circuit semiconductor device according to another embodiment of the present invention.
Figure 37:
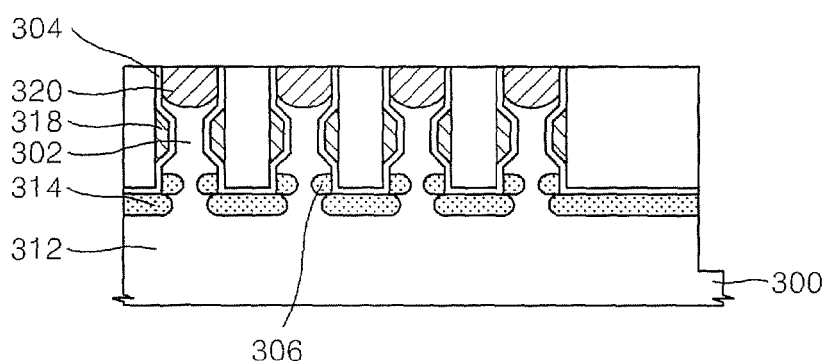

An integrated circuit semiconductor device including one-level transistors and a fabrication method thereof according to embodiments of the present invention will now be described. Integrated Circuit Semiconductor Device Including One-Level Transistor FIG. 1 is a plan view for explaining an integrated circuit semiconductor device according to embodiments of the present invention, and FIGS. 6, 17 and 28 are cross-sectional views taken along lines I-I', II-II' and III-II' of FIG. 1. FIGS. 34 and 35 are cross-sectional views for explaining an integrated circuit semiconductor device according to another embodiment of the present invention. FIGS. 36 and 37 are cross-sectional views for explaining an integrated circuit semiconductor device according to another embodiment of the present invention.

Specifically, FIG. 1 illustrates a vertical transistor (VPT) on the left side, and a planar transistor (PLT) on the right side. FIG. 6 is a cross-sectional view illustrating both vertical and planar transistors (VPT and PLT) included in one substrate. If necessary, only one of the vertical transistor (VPT) and the planar transistor (PLT) may be included in the substrate.

Referring to FIGS. 1, 6, 17 and 28, the integrated circuit semiconductor device includes a substrate 100 including a first region and a second region, first active patterns 106 and 112 provided in the first region, second active patterns 110 provided in the second region, a vertical transistor provided at the first active patterns 106 and 112, and a planar transistor provided on the second active patterns 110.

The substrate 100 may be a silicon substrate. The substrate 100 includes the first region and the second region. The first region may be a cell array region including cell array transistors, and the second region may be a peripheral region including peripheral circuit transistors.

The first active patterns 106 and 112 are provided on the first region of the substrate 100. The first active patterns 106 and 112 include fin active patterns 112 extending in a first direction, and pillar active patterns 106 separately provided on the fin active patterns 112. The pillar active patterns 106 are provided in one row in a second direction perpendicular to the first direction.

The first active patterns 106 and 112 may have a variety of structures. According to an embodiment, referring to FIGS. 6 and 17 the pillar active patterns 106 of the first active patterns 106 and 112 have upper, middle and lower portions having substantially the same sectional area. According to another embodiment, referring to FIGS. 34 and 35, pillar active patterns 202 of first active patterns 202 and 210 each have an upper portion having a first sectional area and a lower portion having a second sectional area that is substantially greater than the first sectional area.

According to another embodiment, referring to FIGS. 36 and 37, pillar active patterns 302 of first active patterns 302 and 312 each have an upper portion having a first sectional area, a middle portion having a second sectional area that is substantially smaller than the first sectional area, and a lower portion having a third sectional area that is substantially greater than the second sectional area. The upper portion and the lower portion may have substantially the same sectional area.

A structure of the vertical transistor provided at the first active patterns 106 and 112 varies according to the structure of the first active patterns 106 and 112. This will be described later in detail.

First field insulation layer patterns 118 may be provided between the first active patterns 106 and 112 in order to insulate the first active patterns 106 and 112 from each other. Top surfaces of the first field insulation layer patterns 118 may be substantially higher than top surfaces of the fin active patterns 112 and be substantially lower than top surfaces of the pillar active patterns 106. A portion of each first field insulation layer pattern 118 and a portion of each pillar active pattern 106 are placed not to contact each other. That is, gaps may be placed between the first field insulation layer patterns 118 and the pillar active patterns 106. The gaps are filled with first conductive patterns as will be described later.

The second active patterns 110 are provided on the second region of the substrate 100. Each of the second active patterns 110 has a bar shape extending in the first direction. Also, the second active patterns 110 are not affected by the structure of the first active patterns 106 and 112. The second active patterns 110 have top surfaces at substantially the same height as the top surfaces of the first active patterns 106 and 112.

Second field insulation layer patterns 126 may be provided between the second active patterns 110 in order to insulate the second active patterns 110. The second field insulation layer patterns 126 may have top surfaces at substantially the same location as the top surfaces of the second active patterns 110.

The vertical transistor is provided at the first active patterns 106 and 112. The vertical transistor includes first gate insulation layer patterns 114, first conductive patterns 122, first impurity regions 116 and second impurity regions 124. The first gate insulation layer patterns 114 are provided on side surfaces of the pillar active patterns 106 and the top surfaces of the fin active patterns 112. The first gate insulation layer patterns 114 serve to electrically insulate the first active patterns 106 and 112 from the first conductive patterns 122.

The first conductive patterns 122 extend in the second direction, surrounding side surfaces of the pillar active patterns 106. Each of the first conductive patterns 122 includes a first portion contacting the first active pattern 106 and 112 and a second portion extending from the first portion in a second direction. The first portion of the first conductive pattern 122 serves as a gate electrode, and the second portion of the first conductive pattern 122 serves as a word line. The structure of the first conductive patterns 122 is different according to the structure of the first active patterns 106 and 112. Consequently, the vertical transistor includes a gate structure surrounding the side surfaces of the first active pattern 106 and 112, i.e., the first gate insulation layer patterns 114 and the first conductive patterns 122.

According to an embodiment, referring to FIGS. 6 and 17, each of the first conductive patterns 122 includes first regions having a first width and contacting the side surfaces of the pillar active patterns 106, and a second region having a second width smaller than the first width and extending from the first regions.

In more detail, each first active pattern includes a pillar active pattern and a fin active pattern. According to this embodiment, upper and lower portions of the pillar active pattern have substantially the same sectional area. The first regions of the first conductive patterns 122 contact the side surfaces of the pillar active patterns 106 and the top surfaces of the fin active patterns 112, and the second regions of the first conductive patterns 122 may contact respective top surfaces of the first field insulation layer patterns 118. As shown, the first regions and the second regions of the first conductive patterns 122 have top surfaces at substantially the same height, and the widths of the first regions are wider than those of the second regions. Thus, the second regions protrude down from the first regions.

According to another embodiment, referring to FIGS. 34 and 35, each first active pattern 202 and 210 includes a pillar active pattern 202 having a lower portion with a sectional area that is substantially wider than that of an upper portion, and a fin active pattern 210. First regions of first conductive patterns 216 contact upper side surfaces of the pillar active patterns 202 and lower top surfaces of the pillar active patterns 202, and second regions of the first conductive patterns 216 contact lower side surfaces of the pillar active patterns 202 and top surfaces of first field insulation layer patterns 218. As shown, the first regions and the second regions of the first conductive patterns 217 have top surfaces at substantially the same height, and the widths of the first regions are wider than those of the second regions. Thus, the second regions protrude down from the first regions.

According another embodiment, referring to FIGS. 36 and 37, each first active pattern 302 and 312 includes a pillar active pattern 302 and a fin active pattern 312, and the pillar active pattern 302 has a middle portion having a smaller sectional area than upper and lower portions of the pillar active pattern 302. First regions of first conductive patterns 318 surround the middle portions of the pillar active patterns 302, and the second regions of the first conductive patterns 318 extend from the first regions. The second regions may contact to top surfaces of first field insulation layer patterns 316.

The first impurity regions 116 are provided in upper surfaces of the fin active patterns 112 of the first active patterns 106 and 112. The first impurity regions 116 serve as a source/drain of the vertical transistor. The first impurity regions 116 extend in a direction in which the fin active patterns 112 extend. That is, the first impurity regions 116 extend in the first direction. The impurity regions 116 extending in the first direction may serve as a bit line. The locations and structures of the first impurity regions 116 may become somewhat different according to the structures of the first active patterns 106 and 112 and the first conductive patterns 122.

According to an embodiment, referring to FIGS. 6 and 17, the first impurity regions 116 are provided in the top surfaces of the fin active patterns 112. The first impurity regions 116 not only serve as the source/drain of the vertical transistor but also serve as a bit line.

According to another embodiment, referring to FIGS. 34 and 35, first impurity regions 212 and 214 include high-concentration regions 214 provided in upper surfaces of the fin active patterns 210, and low-concentration regions 212 provided in lower side surfaces of the pillar active patterns 202. The high-concentration regions 214 extend in a direction in which the fin active patterns 210 extend. The high concentration regions 214 and the low-concentration regions 212 of the first impurity regions 214 and 214 serve as a source/drain of the vertical transistor. According to this embodiment, the source/drain has a lightly doped drain (LDD) structure. The high-concentration regions 214 of the first impurity regions 212 and 214 may serve as bit lines.

Unexplained reference numerals 206, 220, 208 and 240 are first gate insulation layer patterns, second impurity regions, second active patterns and third impurity regions, respectively. Description of the first gate insulation layer patterns, the second impurity regions, the second active patterns and the third impurity regions is omitted because they are substantially identical to second impurity regions, the second active patterns and third impurity regions illustrated in FIGS. 6 and 17, respectively.

According to another embodiment, referring to FIGS. 36 and 37, first impurity regions 306 and 314 include high-concentration regions 314 provided in upper surfaces of the fin active patterns 312, and low-concentration regions 306 provided in lower side surfaces of the pillar active patterns 302. The high-concentration regions 314 extend in a direction that the fin active patterns 312 extend. The first impurity regions 306 and 314 according to this embodiment have substantially identical structure and functions to those of the first impurity regions 206 and 214 illustrated in FIGS. 34 and 35. Thus, description of the first impurity regions 306 and 314 is omitted because it is substantially identical to the description made with reference to FIGS. 34 and 35.

Unexplained reference numerals 304, 320, 308 and 340 are first gate insulation layer patterns, second impurity regions, second active patterns and third impurity regions, respectively. Description of the first gate insulation layer patterns, the second impurity regions, the second active patterns and the third impurity regions is omitted because they are substantially identical to the first gate insulation layer patterns, the second impurity regions, the second active patterns and third impurity regions illustrated in FIGS. 6 and 17, respectively.

The second impurity regions 134 are provided in upper surfaces of the pillar active patterns 106 of the first active patterns 106 and 112. Particularly, the second impurity regions 134 are provided in the upper surfaces of the pillar active patterns 106 defined by the first conductive patterns 122. The second impurity regions 134 serve as a source/drain of the vertical transistor. That is, the second impurity regions 134 may serve as the source/drain, together with the first impurity regions 116.

Although not shown in detail, the second impurity regions 134 may include high-concentration regions and low-concentration regions. In more detail, the low-concentration regions of the second impurity regions 134 may be provided in upper side surfaces of the pillar active patterns 106, and the high-concentration regions of the second impurity regions 134 may be provided in upper surfaces of the pillar active patterns 106.

The first impurity regions 116 and the second impurity regions 134 are provided in upper and lower portions of the first active patterns 106 and 112 with reference to the first conductive patterns 122. Thus, channel regions are formed in a vertical direction along an inner surface of the pillar active patterns 106, with reference to the surface of the substrate 100. For this reason, the vertical transistor may be referred to as a vertical channel transistor.

The planar transistor is provided on the second active patterns 110. The planar transistor includes second gate insulation layer patterns 132, second conductive patterns 130 and third impurity regions 136. The second gate insulation layer patterns 132 are provided on the second active patterns 110 and serve to insulate the second active patterns 110 from the second conductive patterns 132. The second conductive patterns 130 are provided on the second insulation layer patterns 132, and serve as gate electrodes. Thus, a gate structure of the planar transistor includes the second gate insulation layer patterns 132 and the second conductive patterns 130. The second conductive patterns 130 extend in a second direction perpendicular to the second active patterns 110. The extending second conductive patterns 130 may serve as word lines.

The third impurity regions 136 are provided at surfaces of the second active patterns 110 exposed by the second insulation layer patterns 132 and the second conductive layer patterns 130. The third impurity regions 136 serve as a source/drain of the planar transistor. Unlike the first impurity regions 116, the third impurity regions 136 cannot serve as bit lines.

The third impurity regions 136 are provided at the surfaces of the second active patterns 110 exposed by the second gate electric layer patterns 132 and the second conductive patterns 130. Thus, with reference to a surface of the substrate 100, channel regions are formed in a horizontal direction under the second gate electric layer patterns 132, i.e., along surfaces of the second active patterns 110. For this reason, the planar transistor may be referred to as a horizontal channel transistor.

As described above, since the top surfaces of the first active patterns 106 and 112 and the top surfaces of the second active patterns 110 are provided at substantially the same location, the second impurity regions 134 and the third impurity regions 136 can also be provided at substantially the same location. Thus, a pad, a capacitor or conductive patterns formed through subsequent processes can be easily provided.

Fabrication Method of Integrated Circuit Semiconductor Device Including One-Level Transistor A fabrication method of an integrated circuit semiconductor device illustrated in FIGS. 1, 6, 17 and 28 will now be described.

FIGS. 2 through 5 are cross-sectional views for explaining a method of fabricating an integrated circuit semiconductor device illustrated in FIG. 6. FIGS. 7 through 12 are cross-sectional views for explaining a method of forming a capacitor and an interconnection layer further to the integrated circuit semiconductor of FIG. 6. FIGS. 13 through 16 are cross-sectional views for explaining a method of fabricating an integrated circuit semiconductor device illustrated in FIG. 17. FIGS. 18 through 23 are cross-sectional views for explaining a method of forming a capacitor and an interconnection layer further to the integrated circuit semiconductor device of FIG. 17. FIGS. 23 through 27 are cross-sectional views for explaining a method of fabricating an integrated circuit semiconductor device illustrated in FIG. 28. FIGS. 29 through 33 are cross-sectional views for explaining a method of forming an interconnection layer further to the integrated circuit semiconductor device of FIG. 28.

Figure 2:
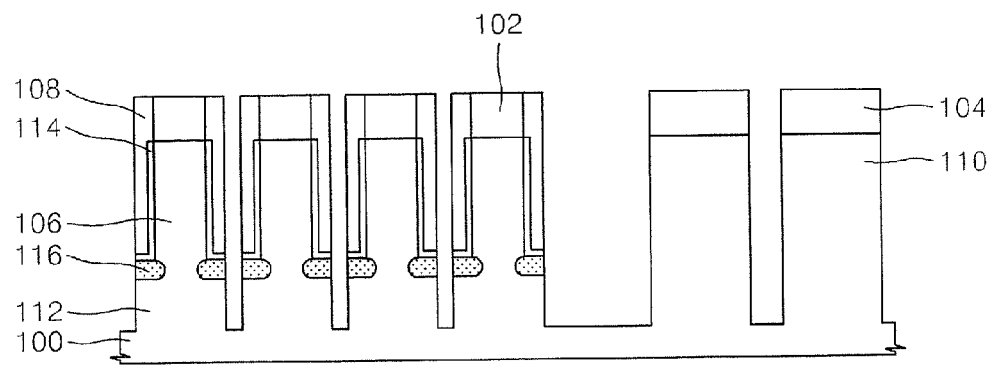
FIGS. 2 through 5 are cross-sectional views for explaining a method of fabricating the integrated circuit semiconductor device of FIG. 6.
Figure 13:
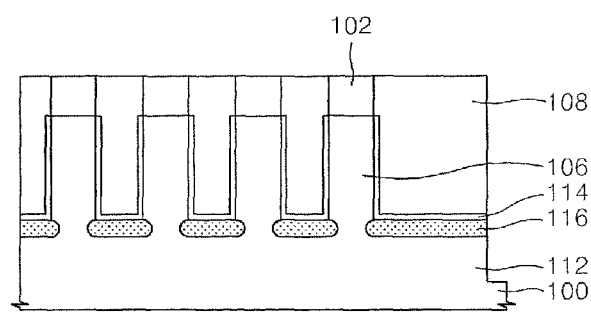
FIGS. 13 through 16 are cross-sectional views for explaining a method of fabricating the integrated circuit semiconductor device of FIG. 17.
Figure 24:
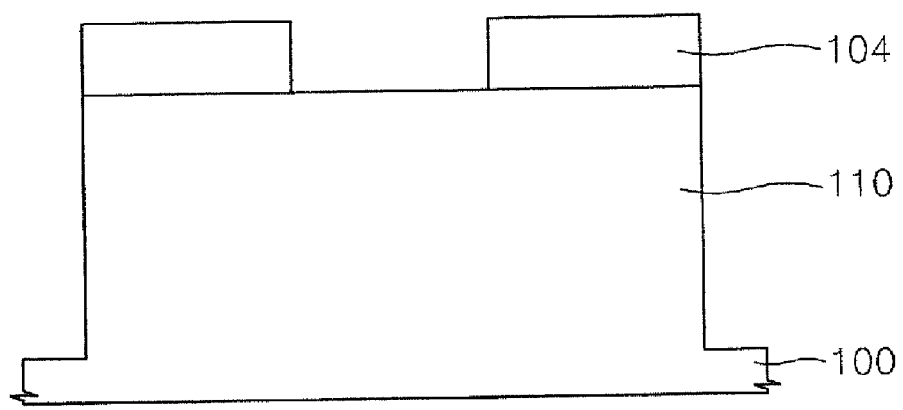
FIGS. 24 through 27 are cross-sectional views for explaining a method of fabricating the integrated circuit semiconductor device of FIG. 28.

Referring to FIGS. 2, 13 and 24, first masks 102 and second masks 104 are formed on a substrate 100. The substrate 100 may be a silicon substrate. The substrate 100 includes a first region and a second region. The first region may be a cell array region including memory cells including a cell array transistor, and the second region may be a peripheral circuit region including a peripheral circuit transistor.

The first masks 102 are formed on the first region of the substrate 100, and may have a hexahedron shape having a first width. The second masks 104 are formed on the second region of the substrate 100, and may have a bar shape extending in a first direction. The second masks 104 may have a second width that is wider than the first width. The first masks 102 and the second masks 104 may be formed by using a nitride such as a silicon nitride. Although not shown in detail, a pad oxide layer may be further formed on the substrate 100 before the first masks 102 and the second masks 104 are formed. The pad oxide layer serves to reduce stress between the first masks 102 and the second masks 104.

Thereafter, the substrate 100 is etched by using the first masks 102 and the second masks 104, thereby forming pillar active patterns 106 of first active patterns 106 and 112 in the first region of the substrate 100, and preliminary second active patterns (not shown) in the second region of the substrate 100. The pillar active patterns 106 of the first active patterns 106 and 112, and the preliminary second active patterns may have substantially the same height, a first height.

A first gate insulation layer (not shown) is formed along a surface profile of the pillar active patterns 106. The first gate insulation layer includes an oxide, and may be formed by a chemical vapor deposition process or a thermal oxidation process. Although not shown, the first gate insulation layer may be formed on the preliminary second active patterns or not.

Preliminary first impurity regions (not shown) are formed in a surface of the substrate 100 including the first gate insulation layer, by using the first masks 102 and the pillar active patterns 106 as an ion implantation mask. A passivation layer (not shown) may be formed in order to prevent impurities from being introduced to surfaces of the preliminary second active patterns. An example of the passivation layer may include a photoresist layer, which is easily deposited and removed.

Third masks 108 are formed to surround sidewalls of the pillar active patterns 106 on which the first gate insulation layer is formed. The third masks 108 extend in the first direction. The third masks 108 includes a material having etching selectivity with respect to the first masks 102 and the second masks 104, and an example of the material may be, e.g., a silicon nitride.

The first region of the substrate 100 is etched by using the third masks 108, the first masks 102 and the pillar active patterns 106 as an etch mask, thereby forming fin active patterns 112 extending in the first direction. Thus, the first active patterns 106 and 112 including the fin active patterns 112 and the pillar active patterns 106 may be formed in the first region of the substrate 100.

The preliminary first impurity regions and the first gate insulation layer are partially etched by an etching process, thereby forming first impurity regions 116 and first gate insulation patterns 114. In more detail, the first impurity regions 116 are formed in the upper surface of the fin active patterns 112, and extend in the first direction, which is substantially the same as the extension direction of the fine active patterns 112. The first gate insulation layer patterns 114 are formed to surround side surfaces of the pillar active patterns 106, and formed partially on the fin active patterns 112.

While the first region of the substrate 100 is etched by using the third masks 108, the first masks 102 and the pillar active patterns 106 as an etch mask, the second region of the substrate 100 is also etched by using the second masks 104 and the preliminary second active patterns, thereby forming second active patterns 110. The second active patterns 110 have a second height that is higher than the first height. The second height is substantially identical to the sum of the height of the fine active pattern 112 and the height of the pillar active pattern 106, i.e., the height of the first active pattern 106 and 112.

As the height of the second active patterns 110 become higher, isolation between the second active patterns 110 gets easier. In more detail, the second active patterns 110 having high heights can prevent impurities of third impurity regions formed in a surface of the second active patterns 110 in a subsequent process from flowing into the adjacent second active patterns 110. The detailed description will be made later in detail.

By the above processes, the first masks 102, the first active patterns 106 and 102 including the fin active patterns 112 and the pillar active patterns 106, the first gate insulation layer patterns 114, the third masks 108 and the first impurity regions 116 are formed in the first region of the substrate 100. Also, the second masks 104 and the second active patterns 110 are formed in the second region of the substrate 100.

The pillar active patterns 106 of the first active patterns 106 and 112, and the second active patterns 110 have top surfaces at substantially the same height. This facilitates subsequent processes.

Figure 3:
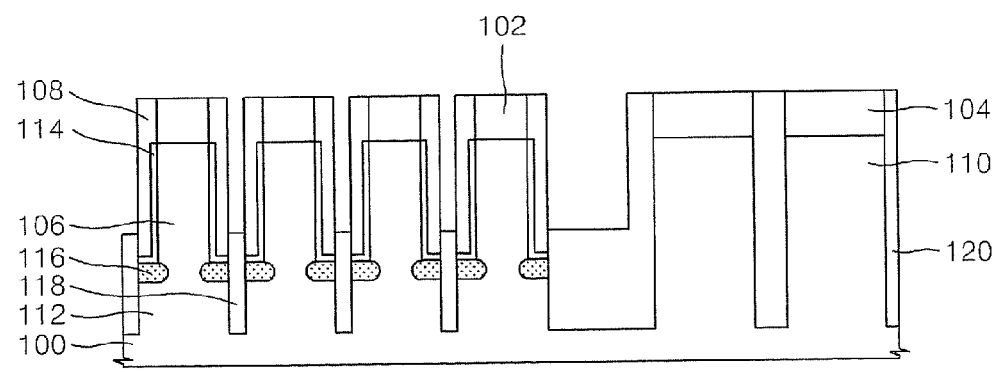
Figure 14:
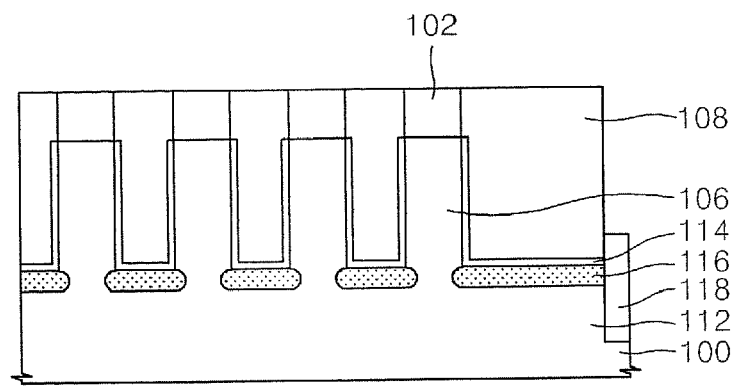
Figure 25:
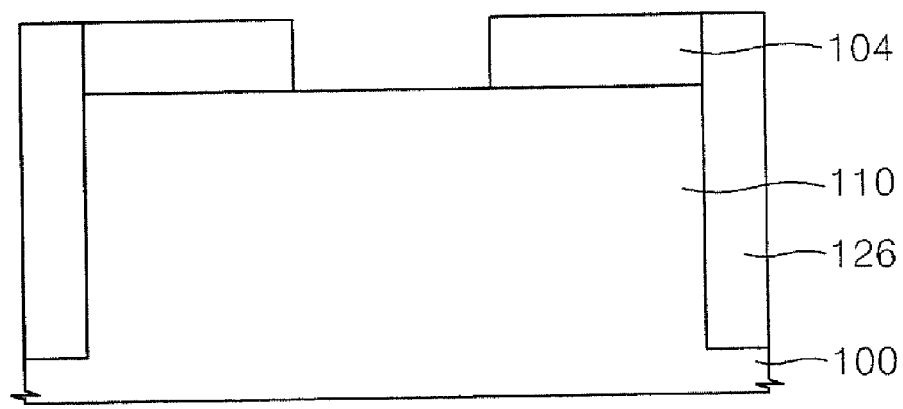
Figure 26:
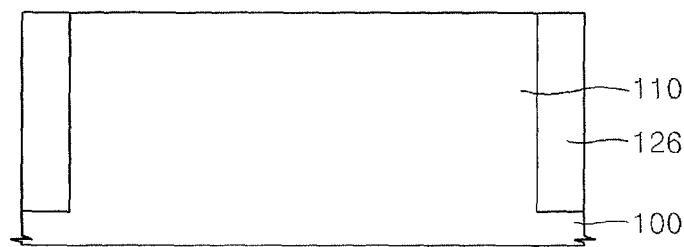

Referring to FIGS. 3, 14 and 25, first field insulation layer patterns 118 are partially filled in the substrate 100 between the first active patterns 106 and 112, and preliminary second field insulation layer patterns 120 are filled between the second active patterns 110.

A process of forming the first field insulation layer pattern 118 and the preliminary second field insulation layer patterns 120 will now be briefly described. A field insulation layer is formed on the substrate 100, the first masks 102, the second masks 104 and the third masks 108 to completely fill up spaces between the first active patterns 106 and 112 and between the second active patterns 110. The field insulation layer includes an oxide. Examples of the oxide may include undoped silicate glass (USG), boro-phospho-silicate glass (BPSG), phospho-silicate glass (PSG), flowable oxide (FOX), plasma enhanced deposition of tetra-ethyl-ortho-silicate (PE-TEOS), tonen silazene (TOSZ) and fluoride silicate glass (FSG).

The field insulation layer is etched and/or polished to expose top surfaces of the first masks 102 and the second masks 104. Examples of the etching and/or polishing process may include a chemical mechanical polishing process, an etch-back process, and a combination of the chemical mechanical polishing process and the etch-back process. By the etching and/or polishing process, preliminary first field insulation layer patterns (not shown) are formed in the first region of the substrate 100, and the preliminary second field insulation layer patterns 120 are formed in the second region of the substrate 100.

Upper portions of the preliminary first field insulation layer patterns in the first region of the substrate 100 are etched, thereby forming the first field insulation layer patterns 118 exposing upper portions of side surfaces of the third masks 108. That is, top surfaces of the first field insulation layer pattern 118 are substantially higher than top surfaces of the fin active patterns 112 and substantially lower than top surfaces of the pillar active patterns 106. Although not shown in detail, a passivation layer may be formed on the preliminary second field insulation layer patterns 120 to protect the preliminary second field insulation layer patterns 120 from being etched. The passivation layer may be a photoresist layer that can be easily deposited and removed.

Figure 4:
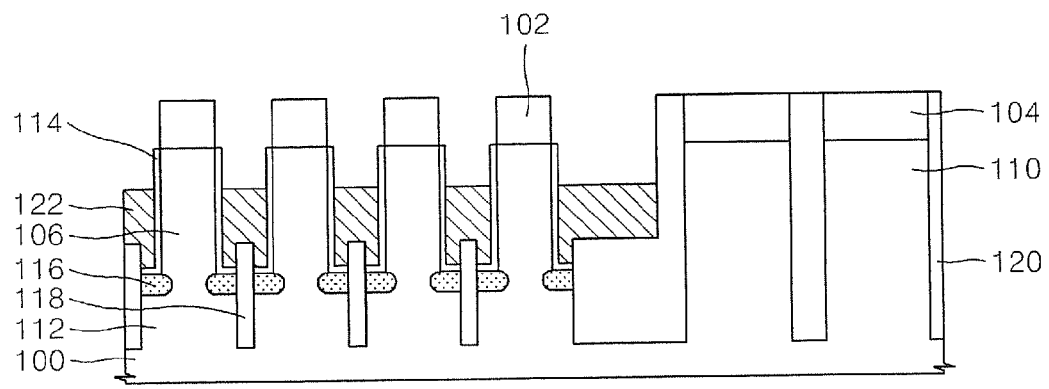
Figure 15:
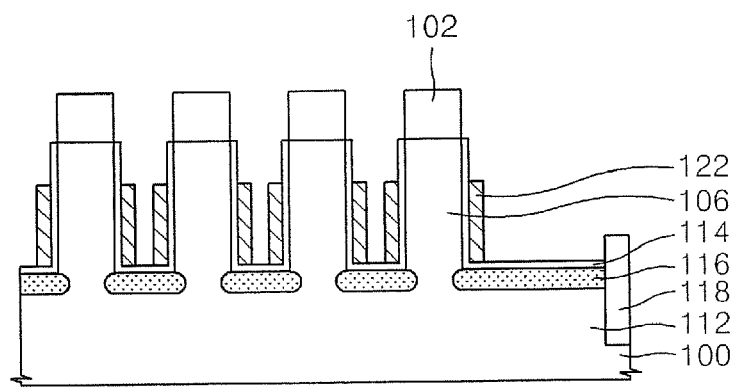

Referring to FIGS. 4 and 15, the third masks 108 are removed to expose the first gate insulation layer patterns 114 formed on the side surfaces of the pillar active patterns 106. By the removal process, gaps are generated between the pillar active patterns 106 and the first field insulation layer patterns 118. In more detail, the gaps expose top portions of the fin active patterns 112, portions of the side surfaces of the first field insulation layer patterns 118, and lower side portions of the pillar active patterns 106.

To fill the gaps, a first conductive layer (not shown) is formed on the first active patterns 106 and 112, the first field insulation layer patterns 118 and the first masks 102. An upper portion of the first conductive layer is etched and/or polished to expose top portions of the first masks 102. Examples of the etching or polishing process may include a chemical mechanical polishing process, an etch-back process or a combination process of the chemical mechanical polishing and etch-back processes.

Fourth masks (not shown) are formed on the etched first conductive layer and the first masks 102. The fourth masks extend in the second direction, and may include a nitride. The first conductive layer is etched by using the fourth masks using an etch mask, thereby forming first conductive patterns 122 extending in the second direction.

The first conductive patterns 122 include first regions surrounding side surfaces of the pillar active patterns 106 and second regions extending from the first regions in the second direction. Particularly, the first regions of the first conductive patterns 122 fill the gaps and thus protrude downwardly more than the second regions of the first conductive patterns 122. Thus, the first regions of the first conductive patterns 122 may serve as a gate electrode of the vertical transistor, and the second regions of the first conductive patterns 122 may serve as word lines. Upper portions of the first conductive patterns 122 are etched to expose the first masks 102 and upper portions of the side surfaces of the pillar active patterns 106.

While the third masks 108 are removed, and the first conductive patterns 122 are formed, a passivation layer may be formed in the second region of the substrate 100 in order to protect the second region of the substrate 100 from the removal and etching processes. The passivation layer may be a photoresist layer that can be easily deposited and removed.

Figure 5:
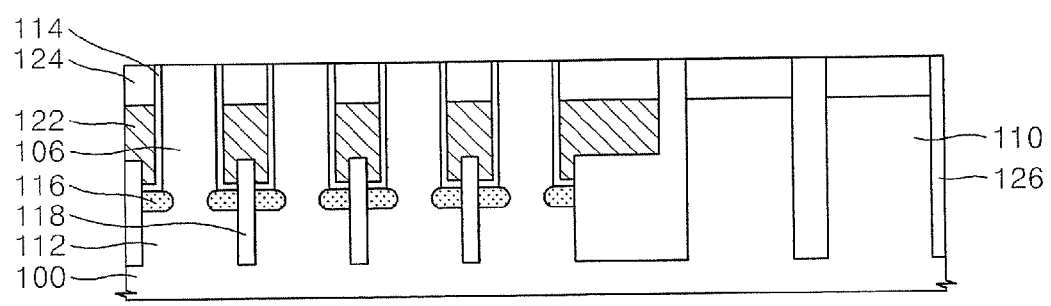
Figure 16:
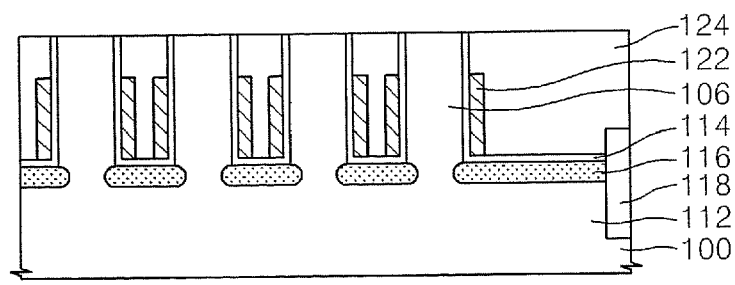

Referring to FIGS. 5, 16 and 25, a first interlayer insulation layer (not shown) is formed on the first conductive patterns 122 and the first masks 102. The first interlayer insulation layer includes an oxide, and examples of the oxide may include USG, BPSG, PSG, FOX, PE-TEOS, TOSZ and FSG. Also, the first interlayer insulation layer may include substantially the same material as the field insulation layer.

An upper portion of the first interlayer insulation layer is polished to expose top surfaces of the first masks 102. The first masks 102 and the second masks 104 are removed to expose top surfaces of the first active patterns 106 and 112 of the first region of the substrate 100, and top surfaces of the second active patterns 110 of the second region of the substrate 100. Particularly, top surfaces of the pillar active patterns 106 of the first active patterns 106 and 112 are exposed by removing the first masks 102.

While the first masks 102 and the second masks 104 are removed, an upper portion of the first interlayer insulation layer and upper portions of the preliminary second field insulation layer patterns 120 are etched, thereby forming first interlayer insulation layer patterns 124 and second field insulation layer patterns 126 having top surfaces at substantially the same height as the top surfaces of the pillar active patterns 106 and the top surfaces of the second active patterns 110.

Although not shown, before the first masks 102 are removed, preliminary second impurity regions may be formed by performing an ion implantation process on upper side surfaces of the pillar active patterns 106. The ion implantation process may be performed, inclined at a predetermined angle with respect to the surface of the substrate 100.

Figure 27:
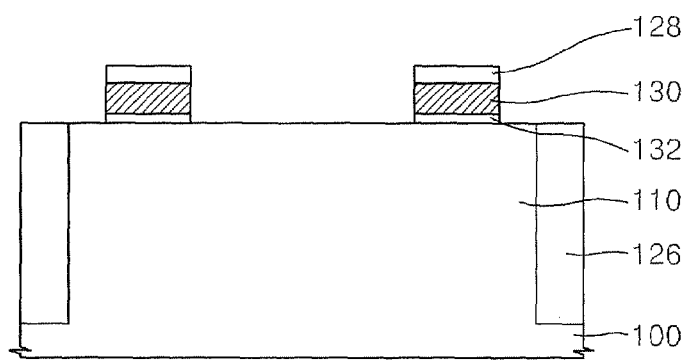

Referring to FIG. 27, a second gate insulation layer (not shown), a second conductive layer (not shown) and fifth masks 128 are formed on the second active patterns 110. The second gate insulation layer includes an oxide, and may be formed by a chemical vapor deposition process or a thermal oxidation process. The second gate insulation layer serves to insulate second active patterns 110 from the second conductive patterns.

The second conductive layer may include polysilicon doped with impurities, metal or a metal compound, and may have a mono-layered or multi-layered structure. The second conductive layer may serve as a gate electrode of a planar transistor. The fifth masks 128 have a bar shape extending in the second direction. The fifth masks 128 may include a nitride such as a silicon nitride. Thereafter, the second gate insulation layer and the second conductive layer are etched by using the fifth masks 128 as an etch mask, thereby forming second gate insulation layer patterns 132 and second conductive patterns 130.

Referring to FIGS. 6, 17 and 28, second impurity regions 134 and third impurity regions 136 are formed in upper surfaces of the pillar active patterns 106, and upper surfaces of the second active patterns 110 exposed by the second conductive patterns 130 and the second gate insulation layer patterns 132, respectively.

Although not shown, the second impurity regions 134 may include low-concentration regions formed in upper side portions of the pillar active patterns 106, and high-concentration regions formed in upper surfaces of the pillar active patterns 106. The third impurity regions 136 include high-concentration regions and low-concentration regions formed in surfaces of the second active patterns 110 exposed by the second gate insulation layer patterns 132 and the second conductive patterns 130.

The low-concentration regions of the third impurity regions 136 may be formed adjacent to the second gate insulation layer patterns 132, and the high-concentration regions of the third impurity regions 136 may be spaced apart from the second gate insulation layer patterns 132 at a predetermined distance. After the low-concentration regions of the third impurity regions 136 are formed first, spacers may be formed on sidewalls of the second gate insulation layer patterns 132, the second conductive patterns 130 and the fifth masks 128, and then the high-concentration regions of the third impurity regions 136 may be formed.

Thus, the vertical transistor is formed in the first region of the substrate 100, which includes the first impurity regions 116, the first gate insulation layer patterns 114, the first conductive patterns 122 and second impurity regions 134. Also, the planar transistor is formed in the second region of the substrate 100, which includes the second gate insulation layer patterns 132, the second conductive patterns 130 and the third impurity regions 136.

Since the first impurity regions 116 and the second impurity regions 134 are provided under and above the first conductive patterns 122 in the vertical transistor, channel regions are formed vertically along side surfaces of the pillar active patterns 106. Thus, the vertical transistor may be called a vertical-channel transistor.

Also, since the third impurity regions 136 are placed at the right and left sides of the second conductive patterns 130 in the planar transistor, channel regions are formed horizontally along surfaces of the second active patterns 110. Thus, the planar transistor may be called horizontal-channel transistor. The top surfaces of the pillar active patterns 106 and the top surfaces of the second active patterns 110 have substantially identical heights, subsequent processes of forming contacts and capacitors can be easily implemented.

Figure 7:
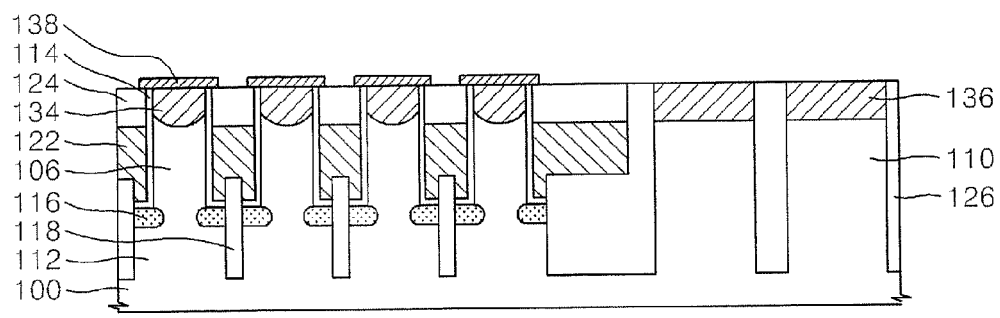
FIGS. 7 through 12 are cross-sectional views for explaining a method of forming a capacitor and an interconnection layer further to the integrated circuit semiconductor device of FIG. 6.
Figure 18:
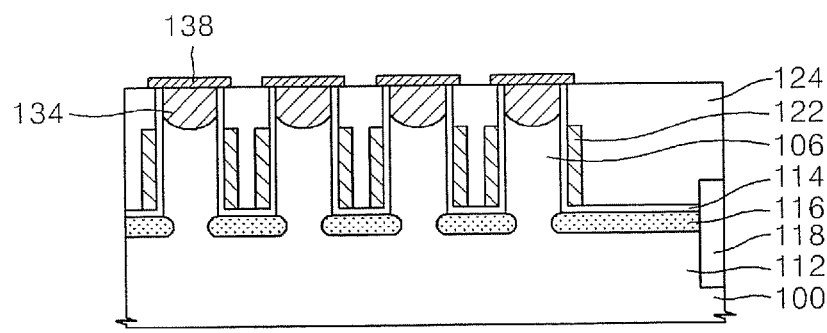
FIGS. 18 through 23 are cross-sectional views for explaining a method of forming a capacitor and an interconnection layer further to the integrated circuit semiconductor device of FIG. 17.

Referring to FIGS. 7 and 18, epitaxial silicon patterns 138 are formed on the second impurity regions 134 of the first active patterns 106 and 112. An epitaxial silicon layer may be formed by a selective epitaxial growth process. The selective epitaxial growth process is a process of growing a silicon layer only on a material layer including silicon such as surfaces of the pillar active patterns 106, not on a material layer including an oxide, such as the first interlayer insulation layer patterns 124.

The epitaxial silicon patterns 138 formed by the selective epitaxial process may have widths wider than those of the second impurity regions 134. This is because the selective epitaxial process grows the silicon layer not only vertically but also horizontally.

Thus, the epitaxial silicon patterns 138 having a wider line width than the pillar active patterns 106 are formed on the pillar active patterns 106, so that contacts formed in a subsequent process may contact the first active patterns 106 and 112 over a wider area. That is, resistance between the contacts and the first active patterns 106 and 112 can be reduced.

Figure 8:
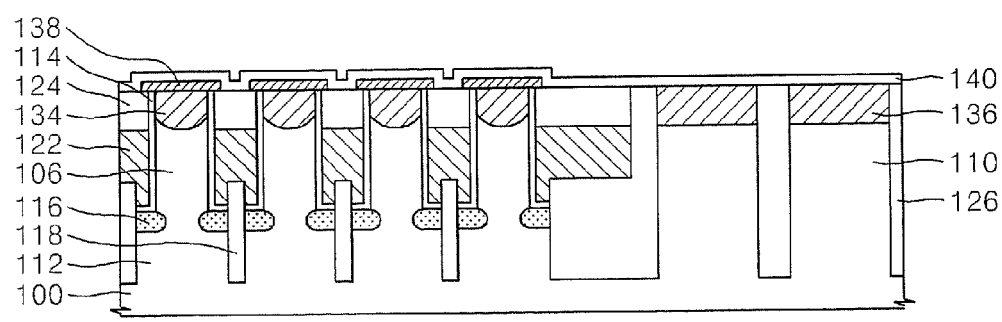
Figure 19:
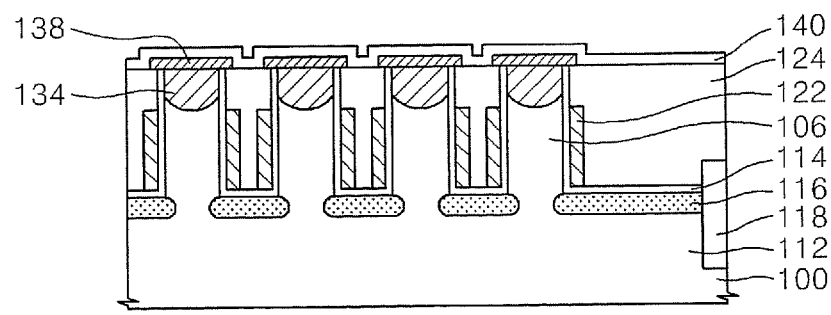
Figure 29:
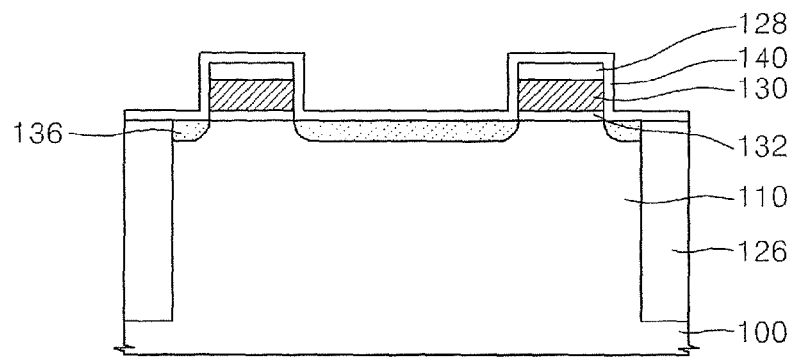
FIGS. 29 through 33 are cross-sectional views for explaining a method of forming an interconnection layer further to the integrated circuit semiconductor device of FIG. 28.

Referring to FIGS. 8, 19 and 29, an etch stop layer 140 is formed continuously along surface profiles of the epitaxial silicon patterns 138, the first interlayer insulation layer patterns 124, the second active patterns 110, the second field insulation layer patterns 126, and the planar transistor. The etch stop layer 140 includes a material having etch selectivity to silicon and oxide, and may include a nitride such as a silicon nitride.

Figure 9:
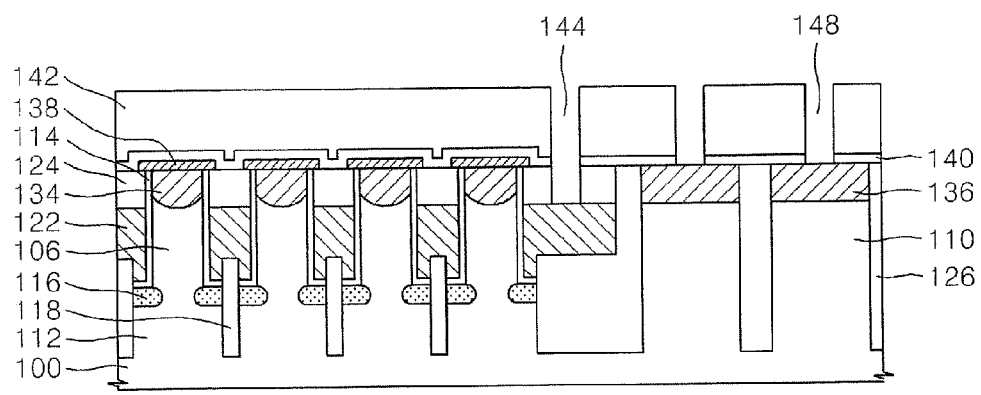
Figure 20:
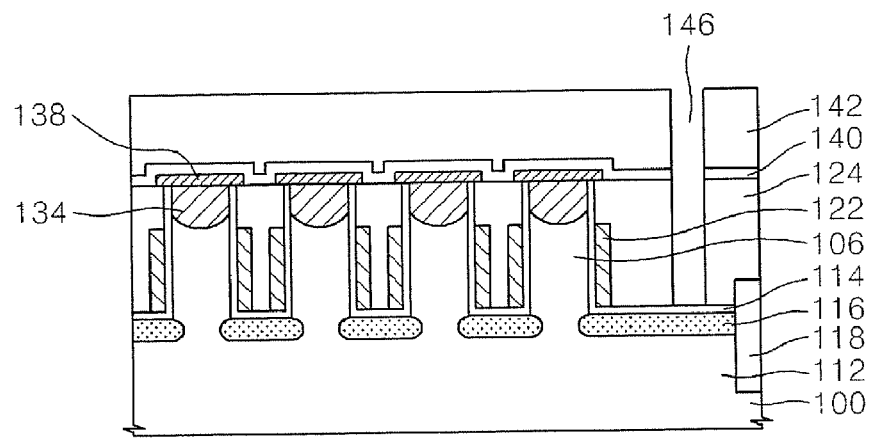
Figure 30:
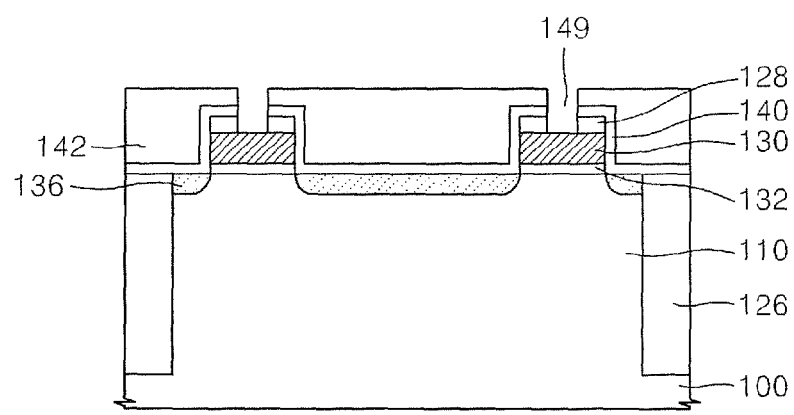

Referring to FIGS. 9, 20 and 30, a second interlayer insulation layer 142 is formed on the etch stop layer 140. The second interlayer insulation layer 142 may be formed in both first and second regions of the substrate 100. The second interlayer insulation layer 142 includes an oxide such as a silicon oxide, and may include, e.g., USG, BPSG, PSG, FOX, PE-TEOS, TOSZ and FSG. The second interlayer insulation layer 142 may include a material, which is substantially identical to or different from the first interlayer insulation layer patterns 124.

Although not shown, an upper portion of the second interlayer insulation layer 142 is polished and/or etched by using a chemical mechanical polishing process, an etch-back process or a combination process of the chemical mechanical polishing and etch-back processes. Sixth masks are formed on the second interlayer insulation layer 142. The second interlayer insulation layer 142, the first interlayer insulation layer patterns 124, the etch stop layer 140 and the fifth masks 128 are partially etched by using the sixth masks as an etch mask, thereby forming first contact holes 144, second contact holes 146, third contact holes 148 and fourth contact holes 149.

In more detail, the first contact holes 144 and the second contact holes 146 are formed in the first region of the substrate 100. The first contact holes 144 expose one set of sides of the second regions of the first conductive patterns 122, and the second contact holes 146 expose one set of sides of the first impurity regions 116, respectively. The third contact holes 148 and the fourth contact holes 149 are formed in the second region of the substrate 100. The third contact holes 148 expose one set of sides of the third impurity regions 136, and the fourth contact holes 148 expose top surfaces of the second conductive patterns 130 of the substrate 100.

Figure 10:
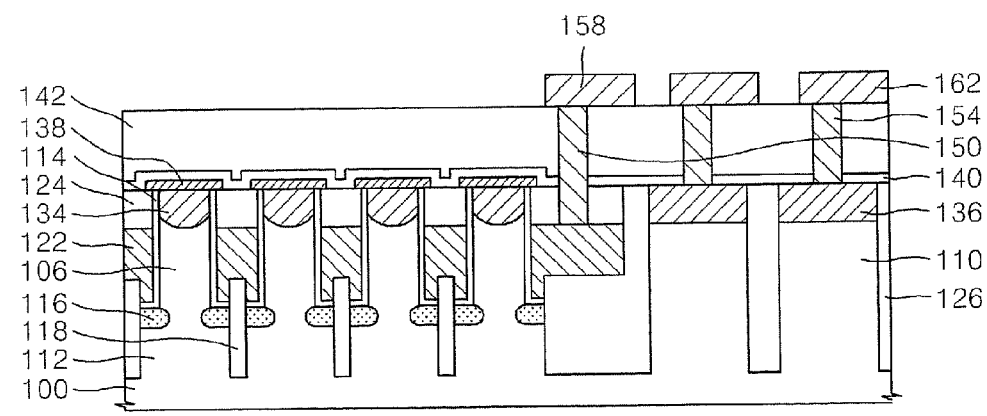
Figure 21:
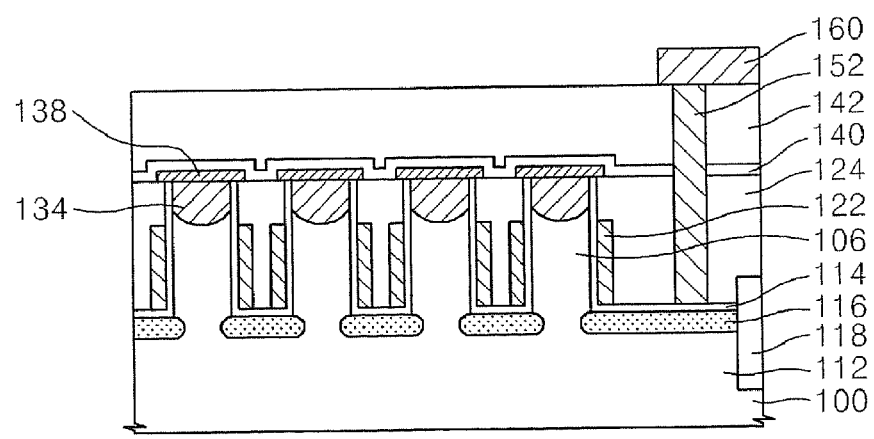
Figure 31:
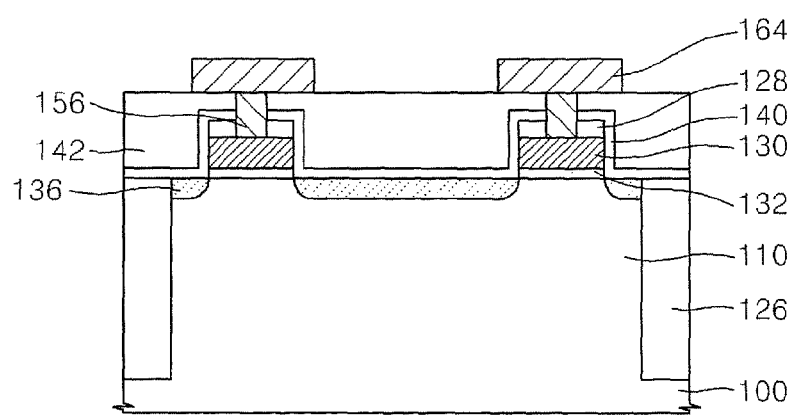

Referring to FIGS. 10, 21 and 31, a third conductive layer is formed on the second interlayer insulation layer 142 to fill the first contact holes 144, the second contact holes 146, the third contact holes 148 and the fourth contact holes 149, and first contacts 150, second contacts 152, third contacts 154 and fourth contacts 156 are respectively formed. The first contacts 150 and the second contacts 162 are formed in the first region of the substrate 100. In more detail, the first contacts 150 are electrically connected to the second regions of the first conductive patterns 122, and the second contacts 152 are electrically connected to the first impurity regions 116.

The third contacts 154 and the fourth contacts 156 are formed in the second region of the substrate 100. In more detail, the third contacts 154 are electrically connected to the third impurity regions 136, respectively, and the fourth contacts 156 are electrically connected to the second conductive patterns 130, respectively.

Thereafter, first interconnection layers 158, second interconnection layers 160, third interconnection layers 162 and fourth interconnection layers 164 are formed on the second interlayer insulation layer 142, and electrically connected to the first contacts 150, the second contacts 152, the third contacts 154 and the fourth contacts 156, respectively. According to this embodiment, the first interconnection layers 158, the second interconnection layers 160, the third interconnection layers 162, and the fourth interconnection layers 164 may be electrically connected to the first contacts 150, the second contacts 152, the third contacts 154 and the fourth contacts 156, respectively by forming and patterning a fourth conductive layer on the second interlayer insulation layer 142.

According to another embodiment, the first interconnection layers 158, the second interconnection layer 160, the third interconnection layers 162 and the fourth interconnection layers 164 may be formed by the following processes: A third interlayer insulation layer is formed on the second interlayer insulation layer 142 and patterned to form a hole exposing the first contacts 150, the second contacts 152, the third contacts 154 and the fourth contacts 156, a fourth conductive layer is formed to fill the hole, and then an upper portion of the fourth conductive layer is etched to expose a top surface of the third interlayer insulation layer.

Figure 11:
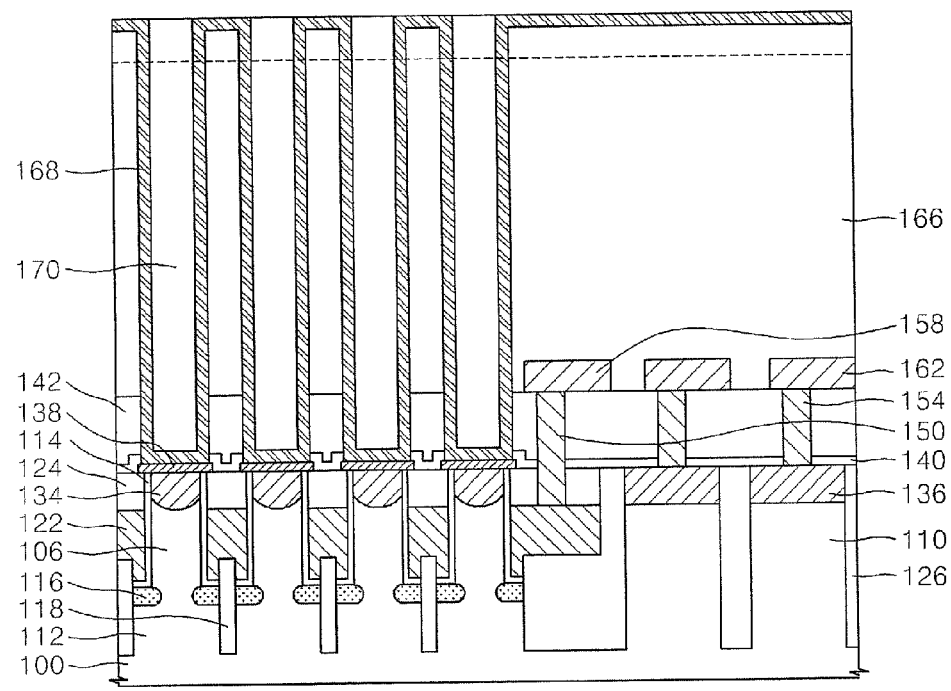
Figure 22:
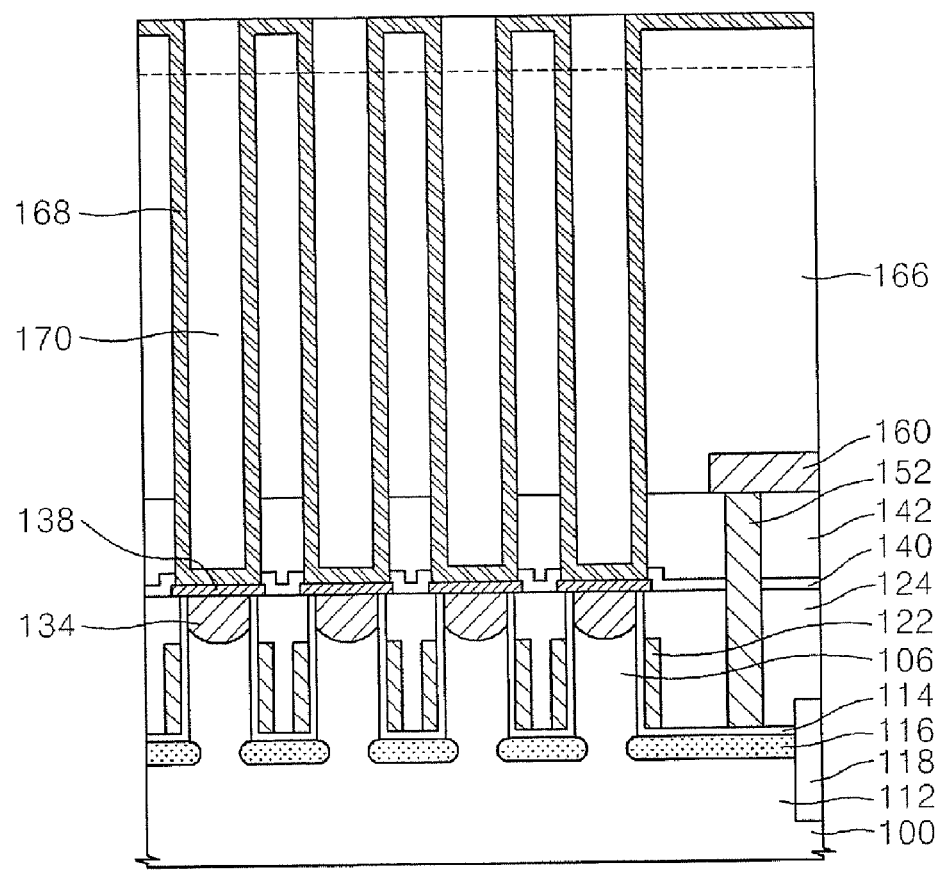
Figure 32:
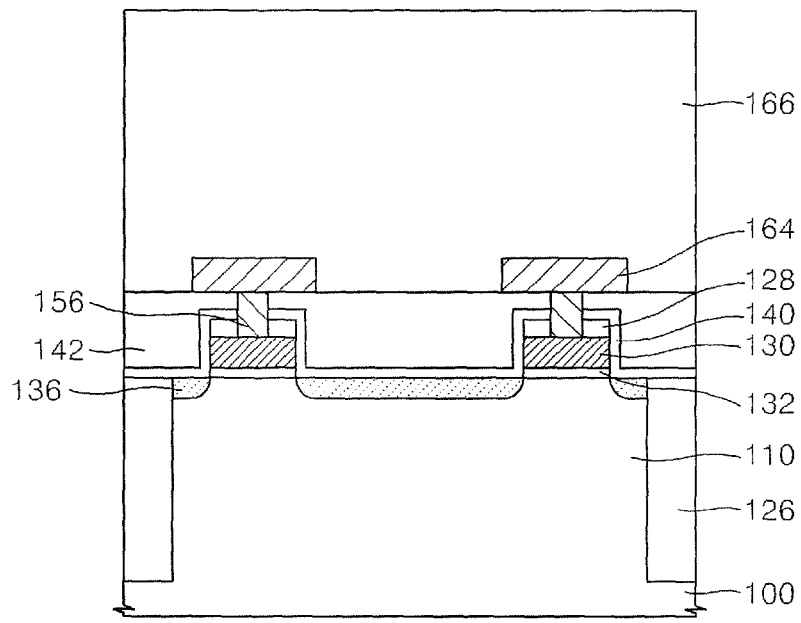

Referring to FIGS. 11, 22 and 32, a third interlayer insulation layer 166 is formed on the first interconnection layers 158, the second interconnection layers 160, the third interconnection layers 162, the fourth interconnection layers 164 and the second interlayer insulation layer 142. The third interlayer insulation layer 166 includes an oxide such as a silicon oxide, and may include, e.g., USG, BPSG, PSG, FOX, PE-TEOS, TOSZ and FSG. The third interlayer insulation layer 166 may include a material substantially identical to or different from the first interlayer insulation layer patterns 124 and the second interlayer insulation layer 142.

Seventh masks (not shown) are formed on the third interlayer insulation layer 166. The third interlayer insulation layer 166, the second interlayer insulation layer 142 and the etch stop layer 140 are partially etched by using the seventh masks as an etch mask, thereby forming holes (not shown) exposing the epitaxial silicon patterns 138 of the first region of the first substrate 100. A fifth conductive layer 168 is formed continuously along surface profiles of the third interlayer insulation layer 166 and the holes. The fifth conductive layer 168 is made not to fill the holes. The first conductive layer 168 may include polysilicon doped with impurities, metal or a metal compound.

To make the fifth conductive layer 168 fill the holes, a sacrificial layer 170 is formed on the third interlayer insulation layer 166 on which the fifth conductive layer 168 has been formed. The sacrificial layer 170 includes an oxide such as a silicon oxide, and may include, e.g., USG, BPSG, PSG, FOX, PE-TEOS, TOSZ and FSG. The sacrificial layer 170 may include a material substantially identical to or different from the first interlayer insulation layer patterns 124, the second interlayer insulation layer 142 and the third interlayer insulation layer 166. An upper portion of the sacrificial layer 170 is polished and/or etched in a direction of a dotted line so as to expose a top surface of the fifth conductive layer 168. Examples of the polishing and/or etching process may include a chemical mechanical polishing process, an etch-back process or a combination process of the chemical mechanical polishing and etch-back processes.

Figure 12:
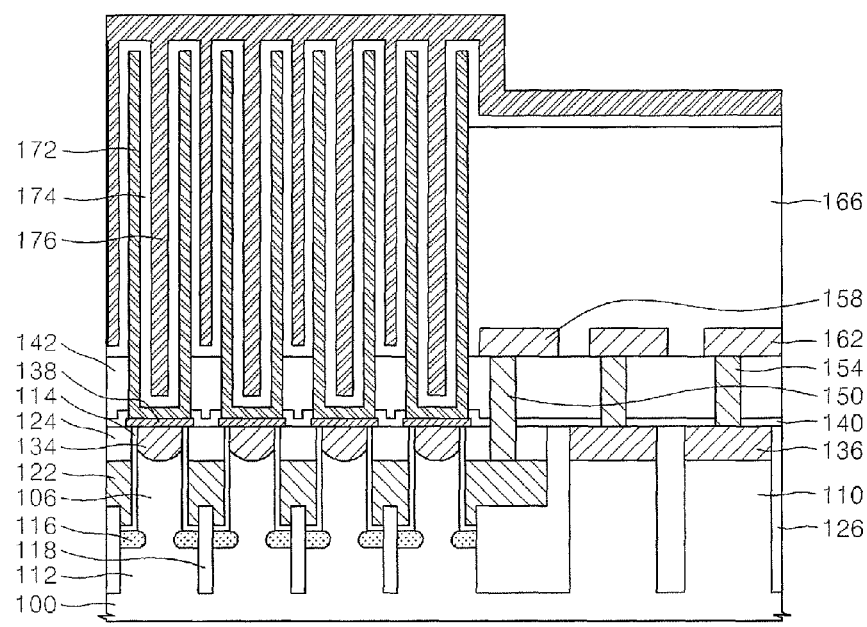
Figure 23:
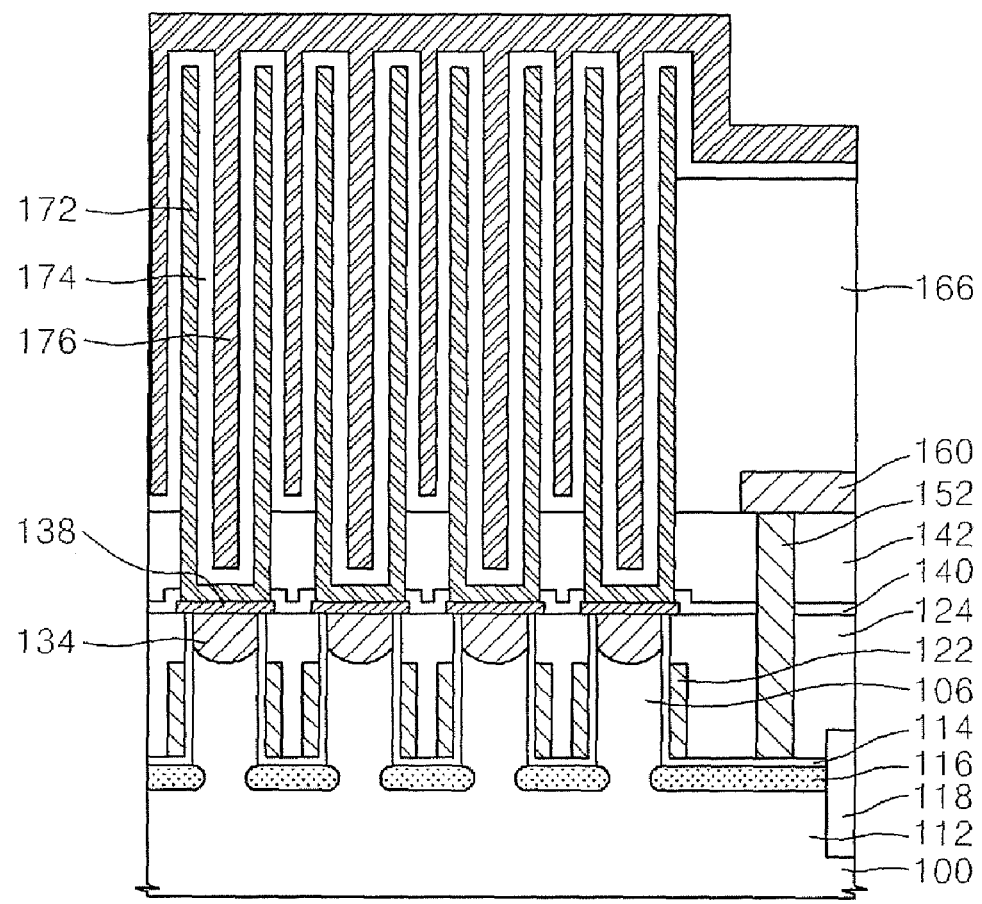
Figure 33:
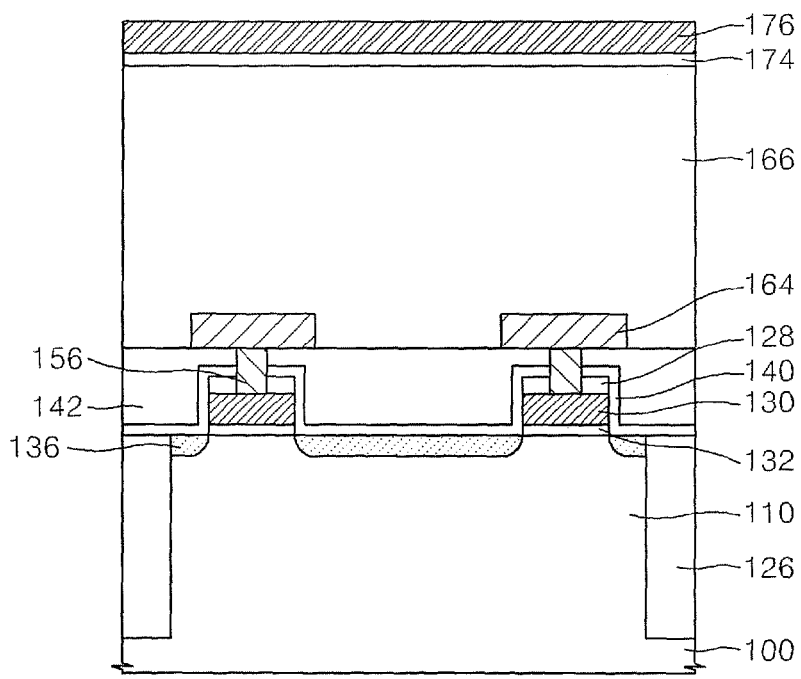

Referring to FIGS. 12, 23 and 33, the sacrificial layer 170 remaining in the holes is removed. While the sacrificial layer 170 is removed, an upper portion of the third interlayer insulation layer 166 may be etched. Thus, node-separated lower electrodes 172 are formed. Thereafter, the lower electrodes 172 serve as storage electrodes of capacitors. Outer upper portions of the lower electrodes 172 may be exposed.

A dielectric layer 174 is formed along surface profiles of the lower electrodes and the third interlayer insulation layer 166. The dielectric layer 174 may include an oxide, oxide/nitride/oxide, or a high-K material, i.e., a material having a high dielectric constant. Examples of the high-K material may include yttrium oxide ($Y_2O_3$), hafnium oxide ($HfO_2$), zirconium oxide ($ZrO_2$), niobium oxide ($Nb_2O_5$), barium titanium oxide ($BaTiO_3$), and strontium titanium oxide ($SrTiO_3$). Upper electrodes 176 are formed on the dielectric layer 174. The upper electrode 176 may include polysilicon doped with impurities, metal or a metal compound.

Thus, cylinder type capacitors including the lower electrodes 172, the dielectric layer 174 and the upper electrodes 176 may be formed. The capacitors are formed on the epitaxial silicon patterns 138, and a sectional area of the epitaxial silicon patterns 138 is greater than a sectional area of upper portions of the pillar active patterns 106. Thus, interface resistance of the capacitors and the epitaxial silicon patterns 138 can be lowered.

Hereinafter, an integrated circuit semiconductor device including stacked-level transistors and a fabrication method thereof will now be described. The integrated circuit semiconductor device including the stacked-level transistors is configured by stacking above-described one-level integrated circuit semiconductor devices through a simple process. Of course, the one-level integrated circuit semiconductor devices may be variously stacked to significantly improve integration density. As mentioned above, an integrated circuit semiconductor device according to the present invention can be fabricated through a simple process when both vertical and planar transistors having different structures are implemented.

Descriptions below will be made on the basis of the above-described integrated circuit semiconductor device including a one-level transistor and fabrication method thereof. One of the above embodiments is applied to the one-level transistor.

In the integrated circuit semiconductor device including stacked-level transistors, interconnection relations for connecting first and second transistors together may vary provided that the first and second transistors are connected by an interconnection layer. In other words, any types of connections between the first and second transistors are possible provided that the first and second transistors are not shorted and are connected by the interconnection layer. Also, shapes of the first and second transistors may be slightly changed when stacked-level transistors are implemented. Although a vertical transistor is used mainly for a cell array transistor and a planar transistor is used for a peripheral circuit transistor in description, the present invention is not limited thereto.

Integrated Circuit Semiconductor Device Including Stacked-Level Transistors

Figure 38:
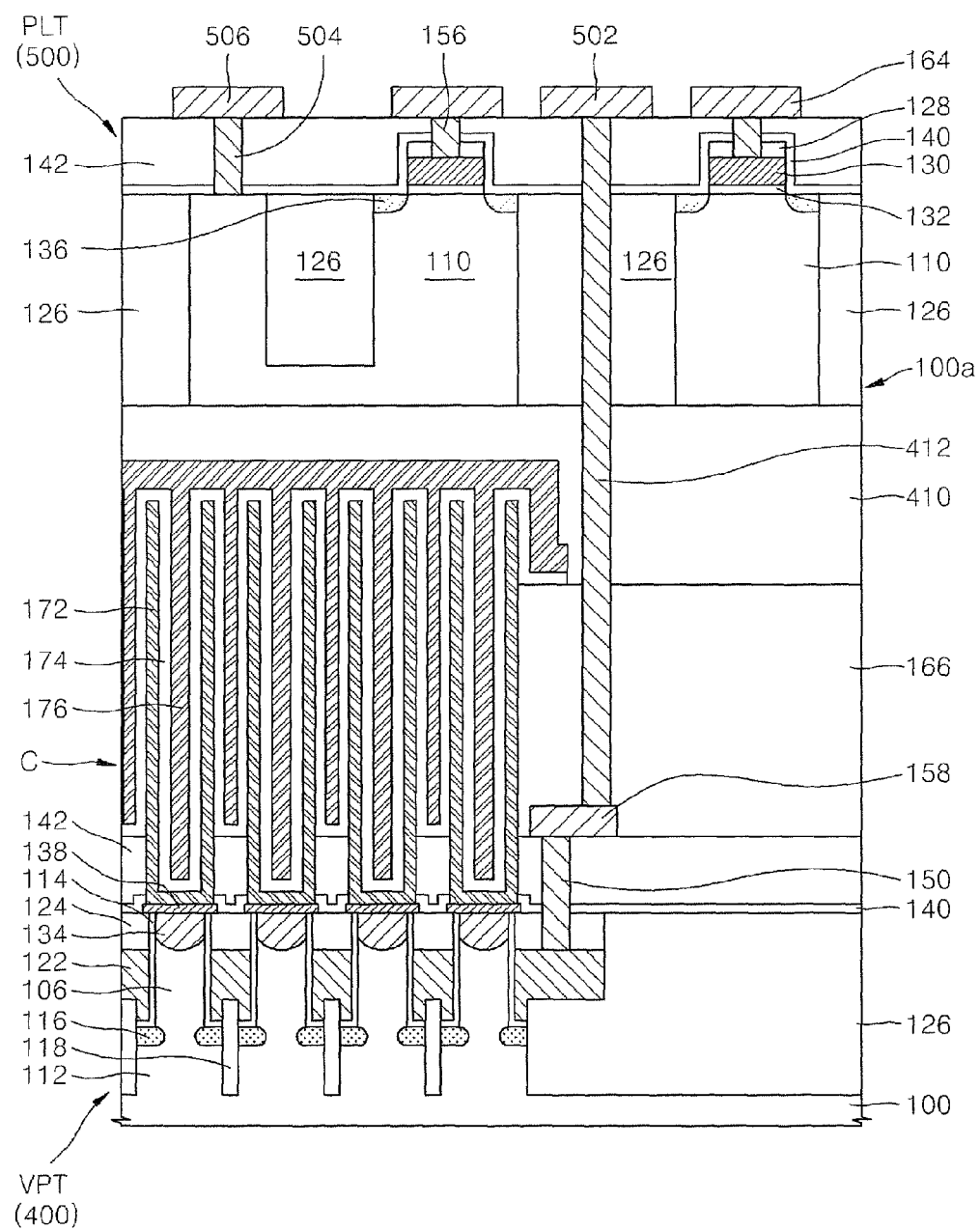
FIGS. 38 and 39 are cross-sectional views including stacked-level transistors according to an embodiment of the present invention.
Figure 39:
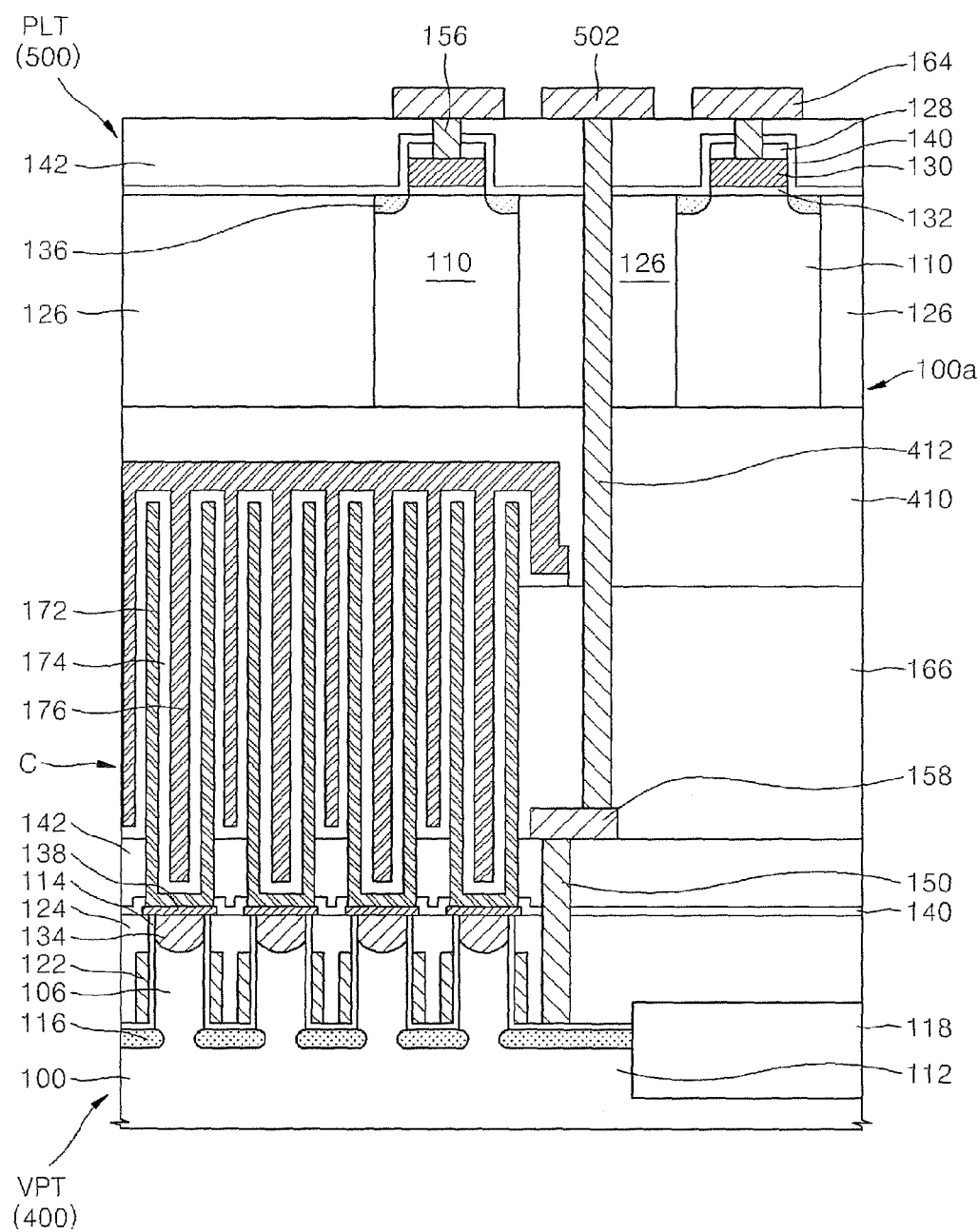

FIGS. 38 and 39 are cross-sectional views of an integrated circuit semiconductor device including stacked-level transistors according to an embodiment of the present invention.

Specifically, the integrated circuit semiconductor device according to the embodiment of FIGS. 38 and 39 includes a first transistor 400 configured with a vertical transistor (VPT) in a lower substrate 100. Description of the vertical transistor (VPT) is omitted since it has been described previously. A capacitor (C) may be formed on the vertical transistor (VPT). A bonding insulation layer 410 is formed on the first transistor 400 including the vertical transistor (VPT). An upper substrate 100a is bonded onto the bonding insulation layer 410. A bonding process of the bonding insulation layer 410 and the upper substrate 100a will be described later in detail.

A second transistor 500 configured with a planar transistor (PLT) as described above is formed at an upper substrate 100a. In FIGS. 38 and 39, the planar transistor (PLT) includes a second field insulation pattern 126 for interconnection between unit transistors. For body contact, a contact 604 is formed in the substrate 100a, and an interconnection layer 506 is formed on the contact 504. The planar transistor (PLT) constituting the second transistor 500 may be a peripheral circuit transistor included in a peripheral circuit device for driving the first transistor 400. Examples of the peripheral circuit device may include a sense amplifier, a word line driver and a support circuit.

A word line 122 and a bit line 116 of the first transistor 400 are connected to a final interconnection layer 502 of the second transistor 500. That is, the word line 122 of the first transistor 400 is connected to the final interconnection layer 502 of the second transistor through a first contact 150, a first interconnection layer 158 and a fifth contact 412. The bit line 116 of the first transistor 400 is connected to the final interconnection layer 502 of the second transistor 500 through a second contact 152, a second interconnection layer 160 and the fifth contact 412. In FIGS. 38 and 39, the first and second interconnection layers 158 and 160 are directly connected to the final interconnection layer 502. However, the first and second interconnection layers 158 and 160 of the first transistor 400 may be connected to the final interconnection layer 502 at another location of the lower substrate 100 if necessary.

The integrated circuit semiconductor device according to the present invention includes the vertical transistor (VPT) as a cell array transistor, and the planar transistor (PLT) as a peripheral circuit transistor, so that more individual transistors can be integrated within a limited substrate area. Accordingly, the integration density can be significantly improved.

Figure 40:
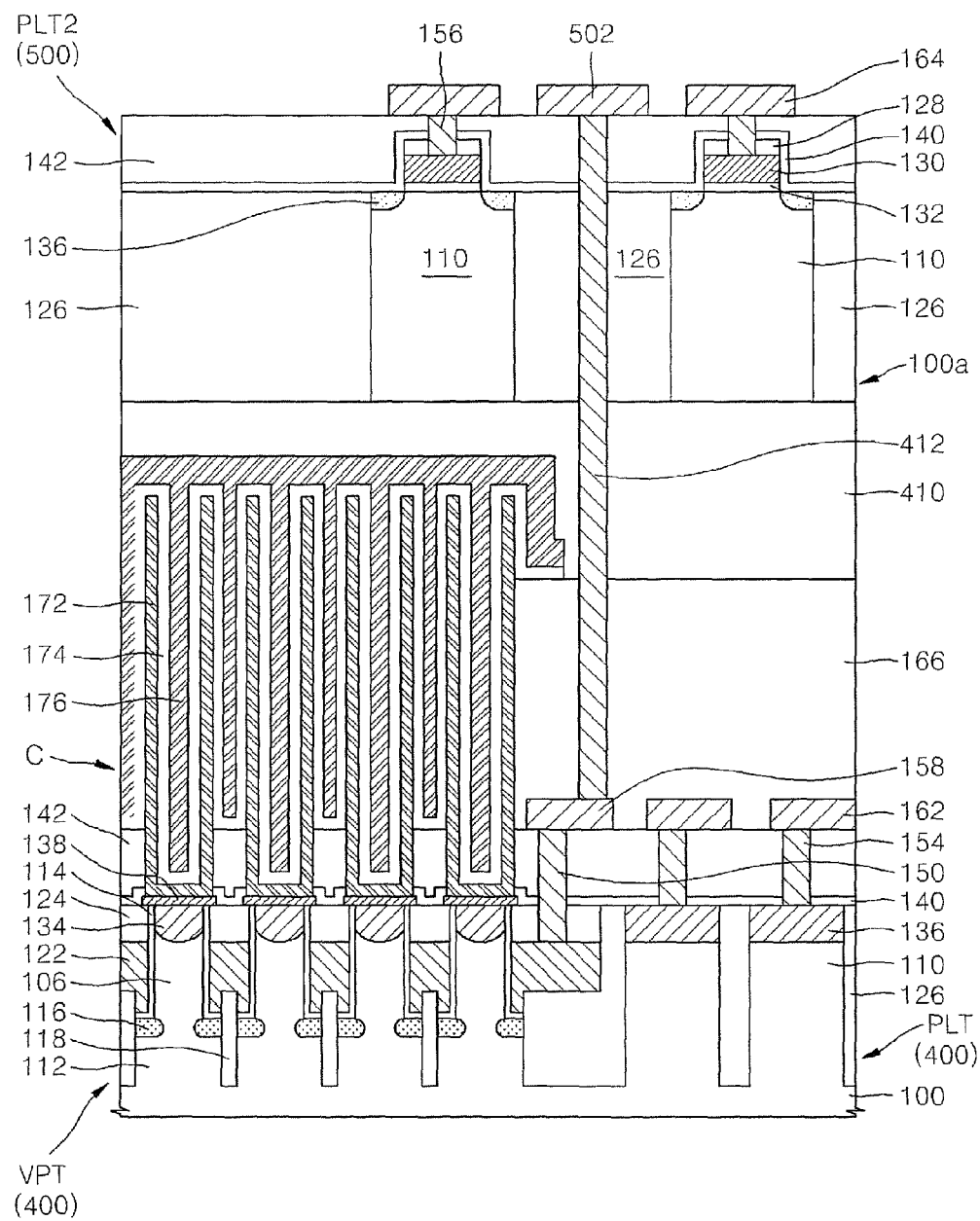
FIG. 40 is a cross-sectional view of an integrated circuit semiconductor device including stacked-level transistors according to another embodiment.

FIG. 40 is a cross-sectional view of an integrated circuit semiconductor device including stacked-level transistors according to another embodiment of the present invention.

Specifically, the integrated circuit semiconductor device according to another embodiment of the present invention is identical to that according to the embodiment of FIGS. 38 and 39, except that a planar transistor (PLT) is further formed at the lower substrate 100.

In more detail, as described above, the vertical transistor (VPT) is formed in a first region of the lower substrate 100, and the planar transistor (PLT) is formed in a second region of the lower substrate 100. Thus, the first transistor 400 at the lower substrate 100 includes the vertical transistor (VPT) and the planar transistor (PLT).

The bonding insulation layer 410 is formed on the first transistor 400. The upper substrate 100*a* is bonded on the bonding insulation layer 410. As described above, the second transistor 500 configured with a planar transistor (PLT2) is formed at the upper substrate 100*a*. According to this embodiment, the planar transistors (PLT and PLT2) constitute a peripheral circuit transistor, and the vertical transistor (VPT) constitutes a cell array transistor. Interconnection relations between the first and second transistors 400 and 500 are identical to those of the embodiment of FIGS. 38 and 39.

The integrated circuit semiconductor device according to the embodiment of FIG. 40 includes the vertical transistor (VPT) as the cell array transistor, and the two planar transistors (PLT and PLT2) as the peripheral circuit transistor, so that the integration density is improved, and various shapes can be implemented, increasing degrees of freedom in device design.

Figure 41:
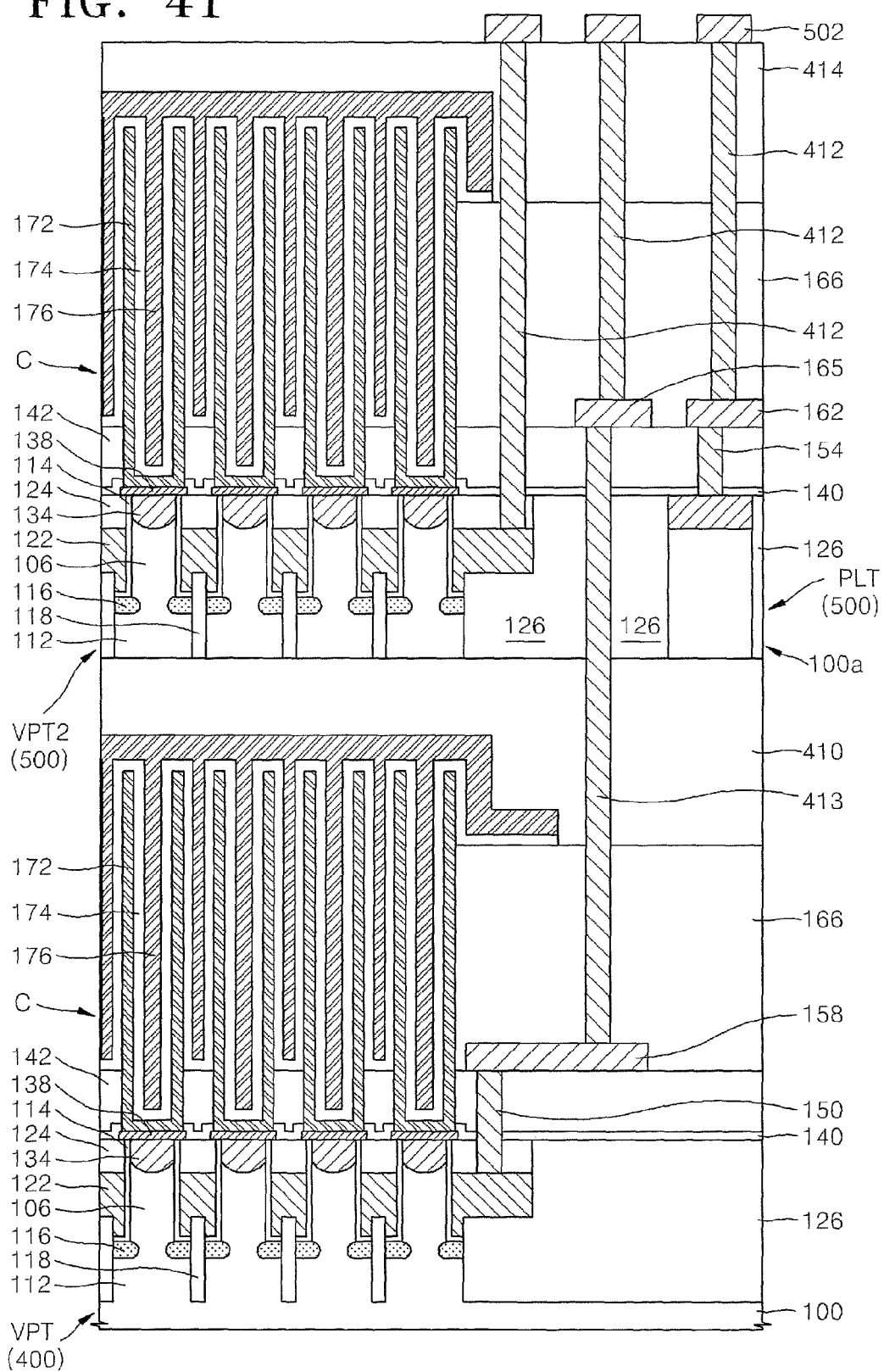
FIG. 41 is a cross-sectional view of an integrated circuit semiconductor device including stacked-level transistors according to another embodiment.

FIG. 41 is a cross-sectional view of an integrated circuit semiconductor device including stacked-level transistors according to another embodiment of the present invention.

Specifically, the integrated circuit semiconductor device according to the embodiment of FIG. 41 is identical to that of the embodiment of FIGS. 38 and 39, except that a vertical transistor (VPT2) is further formed at the upper substrate 100*a*.

In more detail, as described previously, the integrated circuit semiconductor device according to the embodiment of FIG. 41 includes the vertical transistor (VPT) at the lower substrate 100. Thus, the first transistor 400 is configured at the lower substrate 100 as the vertical transistor (VPT).

The bonding insulation layer 410 is formed on the first transistor 400. The upper substrate 100*a* is bonded on the bonding insulation layer 410. The second transistor 500 including the vertical transistor (VPT2) and the planar transistor (PLT) is formed at the upper substrate 100*a*, and an insulation layer 414 is formed on the second transistor. The planar transistor (PLT) constitutes a peripheral circuit transistor, and the vertical transistors (VPT and VPT2) constitute a cell array transistor.

A word line 122 and an impurity region 136 of the second transistor 500 are connected to the final interconnection layer 502 through the fifth contact 412. Interconnection relations of the first transistor 400 and the second transistor 500 are identical to those of the previous embodiment. That is, the first interconnection layer 158 is connected to a fifth interconnection layer 165 through a sixth contact 413, and the fifth interconnection layer 165 is connected to the final interconnection layer 502 through the fifth contact 412. For the convenience, a word line or a bit line of the first transistor 400 is connected to the final interconnection layer 502 at another location (not shown) of the lower substrate.

The integrated circuit semiconductor device according to the embodiment of FIG. 41 includes the two vertical transistors (VPT and VPT2) as the cell array transistor, and the planar transistor (PLT) as the peripheral circuit transistor, so that the integration density can be significantly improved.

Figure 42:
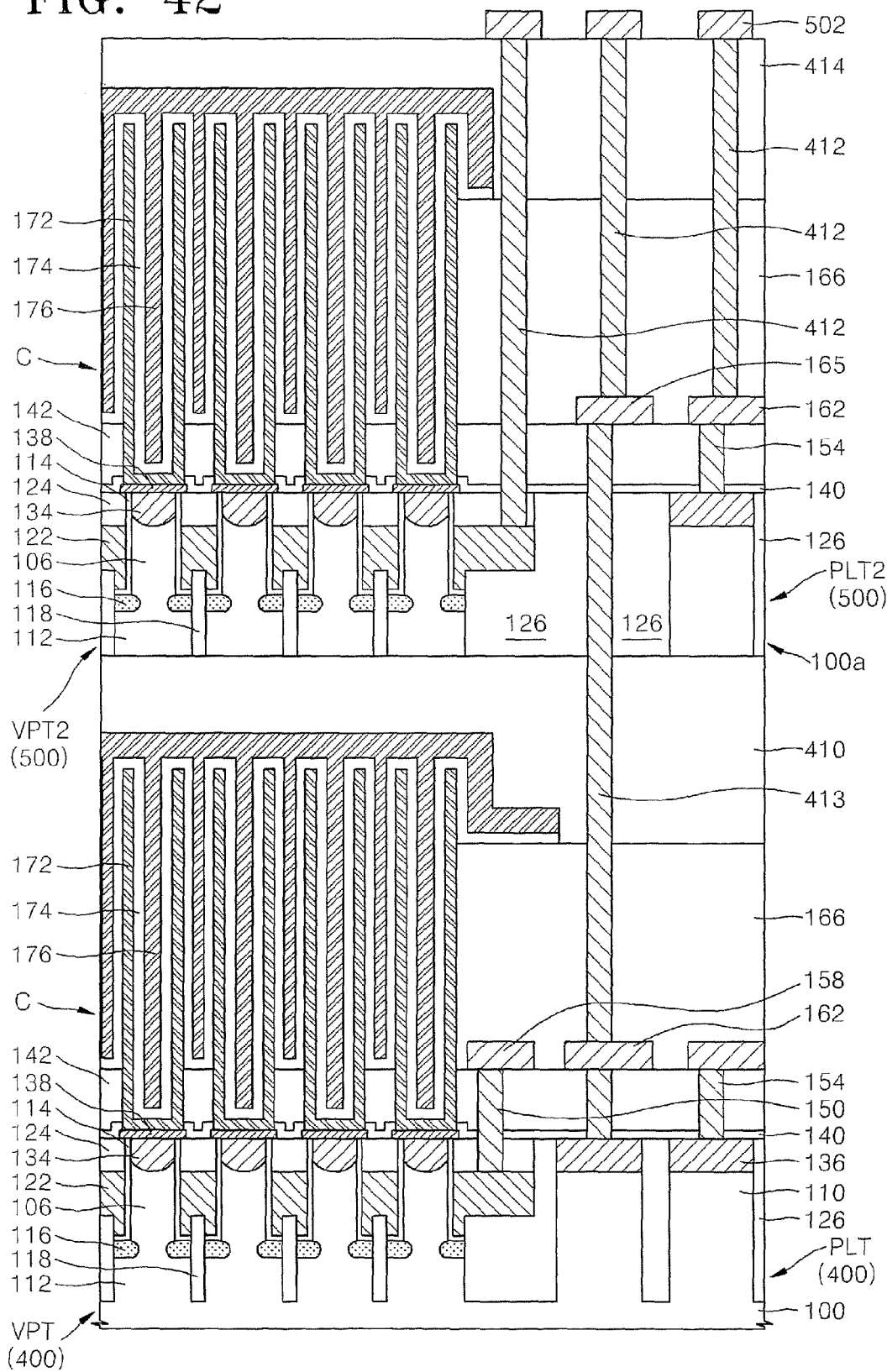
FIG. 42 is a cross-sectional view of an integrated circuit semiconductor device including stacked-level transistors according to another embodiment.

FIG. 42 is a cross-sectional view of an integrated circuit semiconductor device including stacked-level transistors according to another embodiment of the present invention.

Specifically, the integrated circuit semiconductor device according to the embodiment of FIG. 42 is identical to that of the embodiment of FIGS. 38 and 39, except that a planar transistor (PLT) is further formed at the lower substrate 100, and a vertical transistor (VPT2) is further formed at the upper substrate 100*a*.

In more detail, as described above, the vertical transistor (VPT) is formed in the first region of the lower substrate 100, and the planar transistor (PLT) is formed in the second region of the lower substrate 100. Thus, a first transistor including the vertical transistor (VPT) and the planar transistor (PLT) is configured at the lower substrate 100.

The bonding insulation layer 410 is formed on the first transistor 400. The upper substrate 100*a* is bonded on the bonding insulation layer 410. As described above, the second transistor 500 including the vertical transistor (VPT2) and the planar transistor (PLT2) is formed at the upper substrate 100*a*. An insulation layer 414 is formed on the second transistor 500. Thus, the planar transistors (PLT and PLT2) constitute a peripheral circuit transistor, and the vertical transistors (VPT and VPT2) constitute a cell array transistor.

The word line 122 and the impurity region 136 of the second transistor 500 are connected to the final interconnection layer 502 through the fifth contact 412. Interconnection relations of the first transistor 400 and the second transistor 500 are similar to those of the previous embodiment. That is, the second interconnection layer 162 is connected to the fifth interconnection layer 165 through the sixth contact 413, and the fifth interconnection layer 165 is connected to the final interconnection layer 502 through the fifth contact 412. For convenience, a word line or a bit line of the first transistor 400 is connected to the final interconnection layer 502 at another location (not shown) of the lower substrate 100.

The integrated circuit semiconductor device according to the embodiment of FIG. 42 includes the two vertical transistors (VPT and VPT2) as the cell array transistor, and the two planar transistors (PLT and PLT2) as the peripheral circuit transistor, so that the integration density can be significantly improved, degrees of freedom in device design can be increased.

Figure 43:
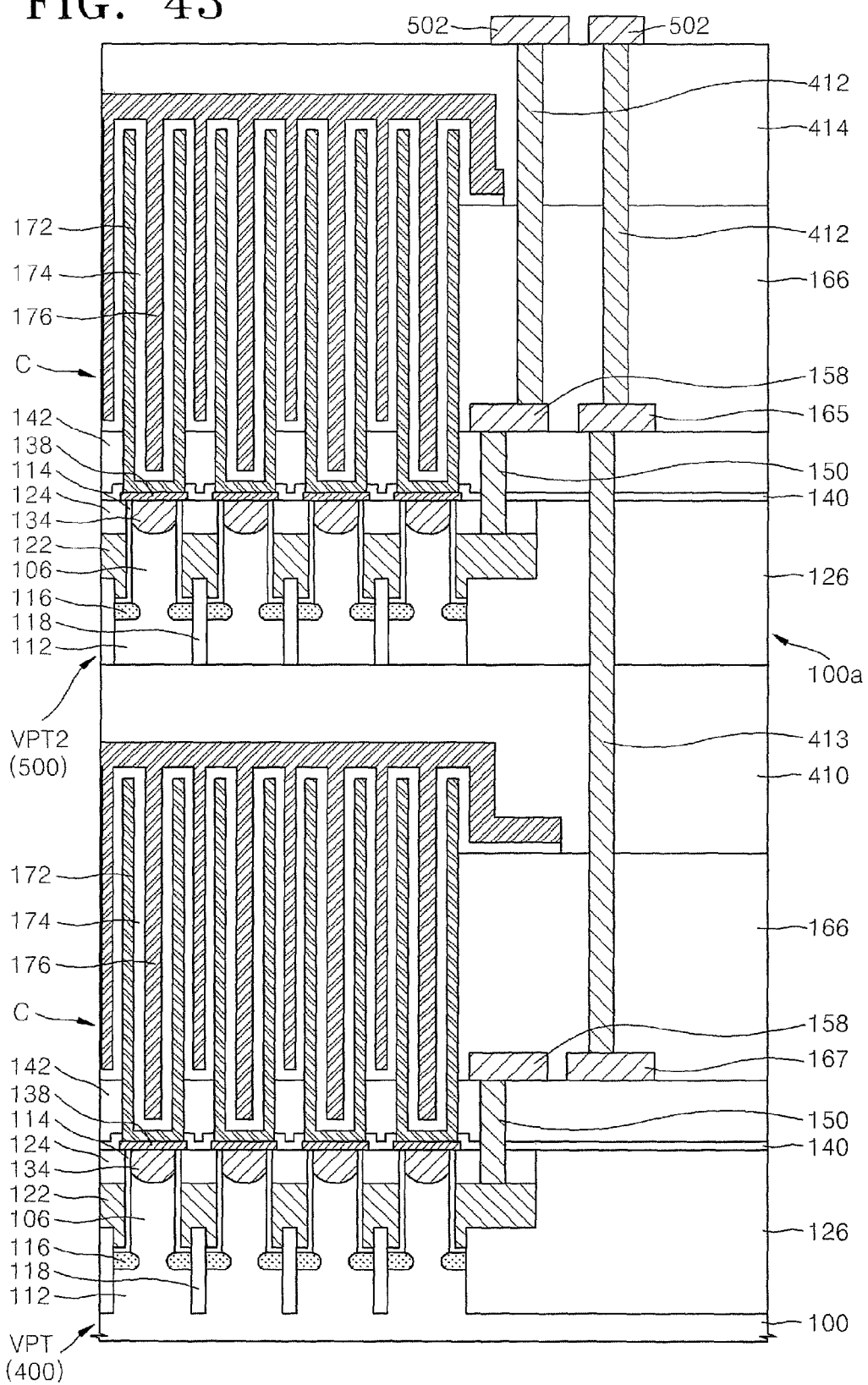
FIG. 43 is a cross-sectional view of an integrated circuit semiconductor device including stacked-level transistors according to another embodiment.

FIG. 43 is a cross-sectional view of an integrated circuit semiconductor device including stacked-level transistors according to another embodiment of the present invention.

Specifically, the integrated circuit semiconductor device according to the embodiment of FIG. 43 is identical to that of the embodiment of FIGS. 38 and 39, except that a vertical transistor (VPT), not the planar transistor (PLT), is formed at the upper substrate 100*a*.

In more detail, as described above, the vertical transistor (VPT) is formed at the lower substrate 100. Thus, the first transistor 400 is configured with the vertical transistor (VPT) at the lower substrate 100. Also, the second transistor 500 is configured with the vertical transistor (VPT2) at the upper substrate 100*a* bonded with the bonding insulation layer 410, and the insulation layer 414 is formed on the second transistor 500. Thus, the one vertical transistor (VPT) constitutes a peripheral circuit transistor, and another vertical transistor (VPT2) constitutes a cell array transistor.

The word line 122 of the second transistor 500 is connected to the final interconnection layer 502 through the fifth contact 412. Interconnection relations of the first transistor 400 and the second transistor 500 are similar to those of the previous embodiment. That is, the sixth interconnection layer 167 is connected to the fifth interconnection layer 165 through the sixth contact 413, and the fifth interconnection layer 165 is connected to the final interconnection layer 502 through the fifth contact 412. For convenience, the word line or bit line of the first transistor 400 is connected to the final interconnection layer 502 at another location (not shown) of the lower substrate 100.

The integration circuit semiconductor device according to the embodiment of FIG. 43 includes the two vertical transistors (VPT and VPT2) as the cell array transistor and the peripheral circuit transistor, so that the integration density can be significantly improved.

Figure 44:
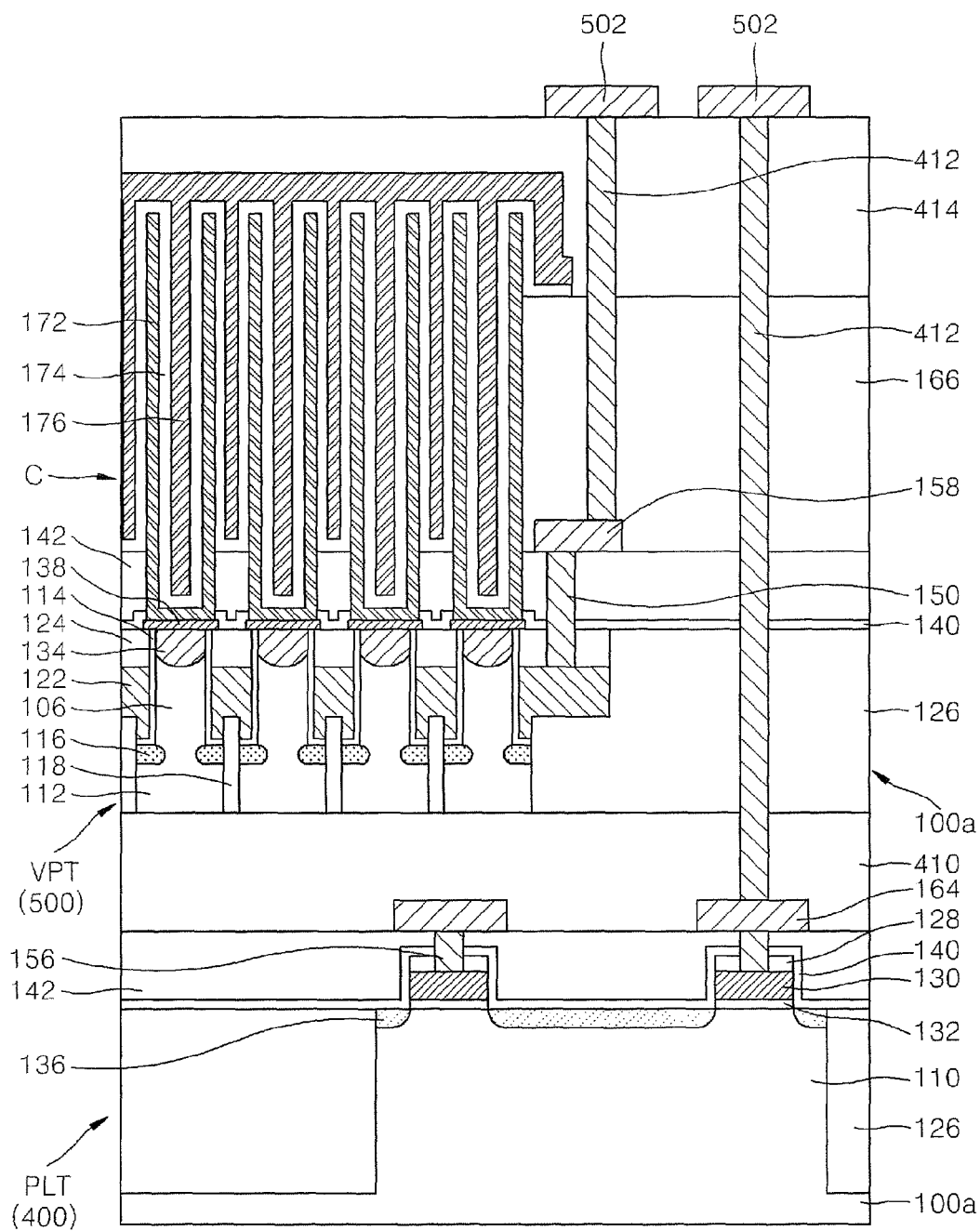
FIG. 44 is a cross-sectional view of an integrated circuit semiconductor device including stacked-level transistors according to another embodiment.

FIG. 44 is a cross-sectional view of an integrated circuit semiconductor device including stacked-level transistors according to another embodiment of the present invention.

Specifically, the integrated circuit semiconductor device according to the embodiment of FIG. 44 includes the first transistor 400 configured with the planar transistor (PLT) at the lower substrate 100. The planar transistor (PLT) may be a peripheral circuit transistor. Description of the planar transistor (PLT) is omitted because it has been described previously. The bonding insulation layer 410 is formed on the first transistor 400 including the planar transistor (PLT). The upper substrate 100a is bonded on the bonding insulation layer 410. A bonding process of the bonding insulation layer 410 and the upper substrate 100a will be described later in detail.

The second transistor 500 configured with the vertical transistor (VPT) is formed at the upper substrate 100a, and the insulation layer 414 is formed on the second transistor 500. The vertical transistor (VPT) constituting the second transistor 500 is a cell array transistor. The first transistor 400 configured with the planar transistor may be a peripheral circuit transistor included in a peripheral circuit device for driving the second transistor 500. Examples of the peripheral circuit device may include a sense amplifier, a word line driver or a support circuit.

A word line 130 (gate electrode) of the first transistor 400 is connected to the final interconnection layer 502 of the second transistor 500. That is, the word line 130 of the first transistor 400 is connected to the final interconnection layer 502 of the second transistor 500 through the fourth contact 156, a fourth interconnection layer 164 and the fifth contact 412. The word line 122 of the second transistor 400 is connected to the final interconnection layer 502 through the fifth contact 412.

The integrated circuit semiconductor device according to the present invention includes the vertical transistor (VPT) as the cell array transistor, and the planar transistor (PLT) as the peripheral circuit transistor, so that more individual transistors can be integrated within a limited substrate area, and thus the integration density can be significantly improved.

Figure 45:
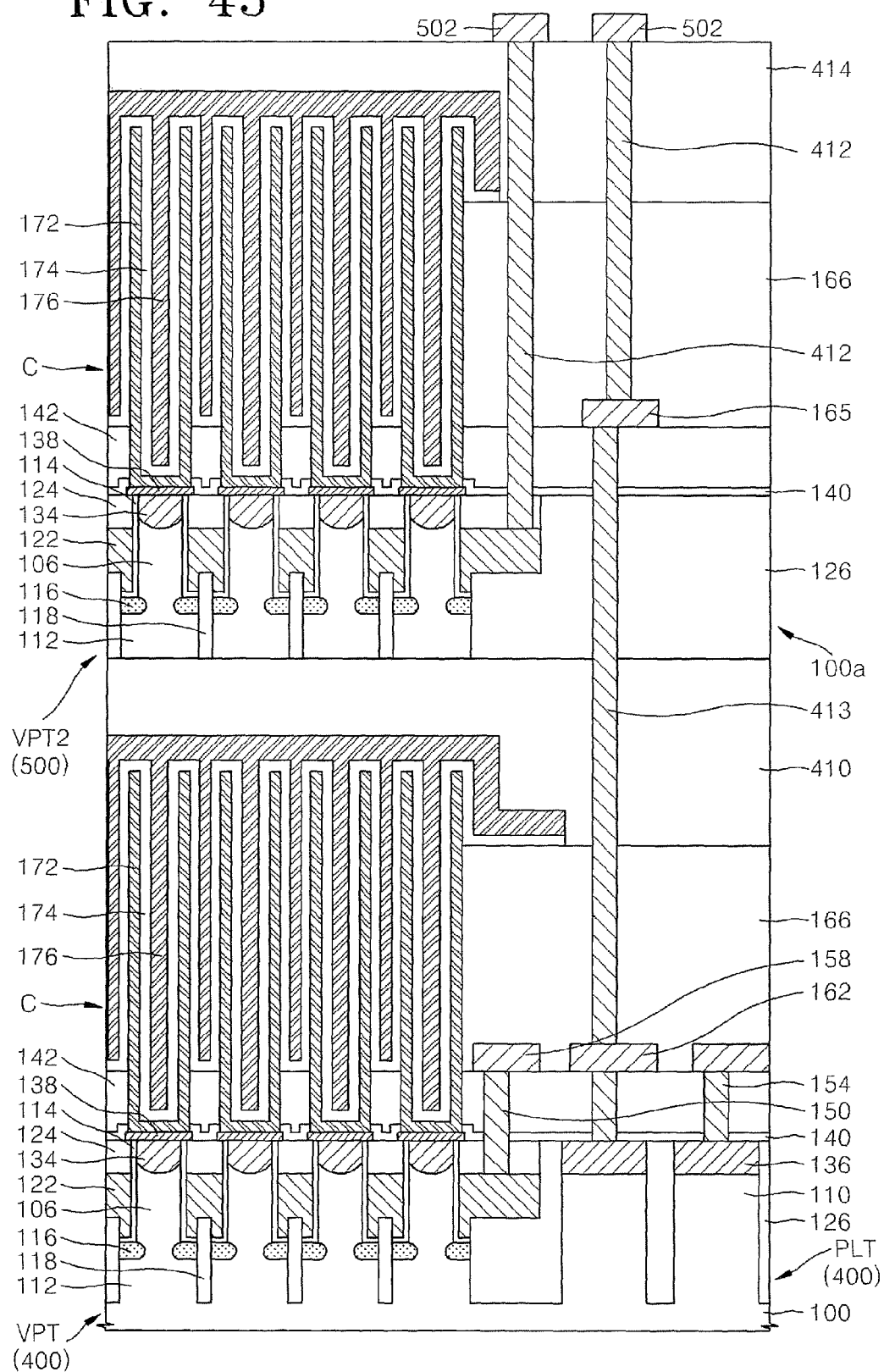
FIG. 45 is a cross-sectional view of an integrated circuit semiconductor device including stacked-level transistors according to another embodiment.

FIG. 45 is a cross-sectional view of an integrated circuit semiconductor device including stacked-level transistors according to another embodiment of the present invention.

Specifically, the integrated circuit semiconductor device according to the embodiment of FIG. 45 is identical to that of the embodiment of FIG. 44, except that a vertical transistor (VPT) is further formed at the lower substrate 100.

In more detail, the vertical transistor (VPT) is formed in a first region of the lower substrate 100, and the planar transistor (PLT) is formed in a second region of the lower substrate 100. Thus, the first transistor 400 is configured with the vertical transistor (VPT) and the planar transistor (PLT) at the lower substrate 100.

As described above, the second transistor 500 configured with the vertical transistor (VPT2) is formed at the upper substrate 100a bonded with the bonding insulation layer 410, and the insulation layer 414 is formed on the second transistor 500. Thus, the two vertical transistors (VPT and VPT2) constitute a cell array transistor, and the one planar transistor (PLT) constitutes a peripheral circuit transistor.

The word line 122 of the second transistor 500 is connected to the final interconnection layer 502 through the fifth contact 412. Interconnection relations of the first transistor 400 and the second transistor 500 are similar to those of the previous embodiments. That is, the third interconnection layer 162 is connected to the fifth interconnection layer 165 through the sixth contact 413, and the fifth interconnection layer 165 is connected to the final interconnection layer 502 through the fifth contact 412. For convenience, the word line or bit line of the first transistor 400 is connected to the final interconnection layer 502 at another location (not shown) of the lower substrate 100.

The integrated circuit semiconductor device according to the embodiment of FIG. 45 includes the two vertical transistors (VPT and VPT2) as the cell array transistor, and the planar transistor (PLT) as the peripheral circuit transistor, so that the integration density can be significantly improved, and the degree of freedom in design can be increased.

Figure 46:
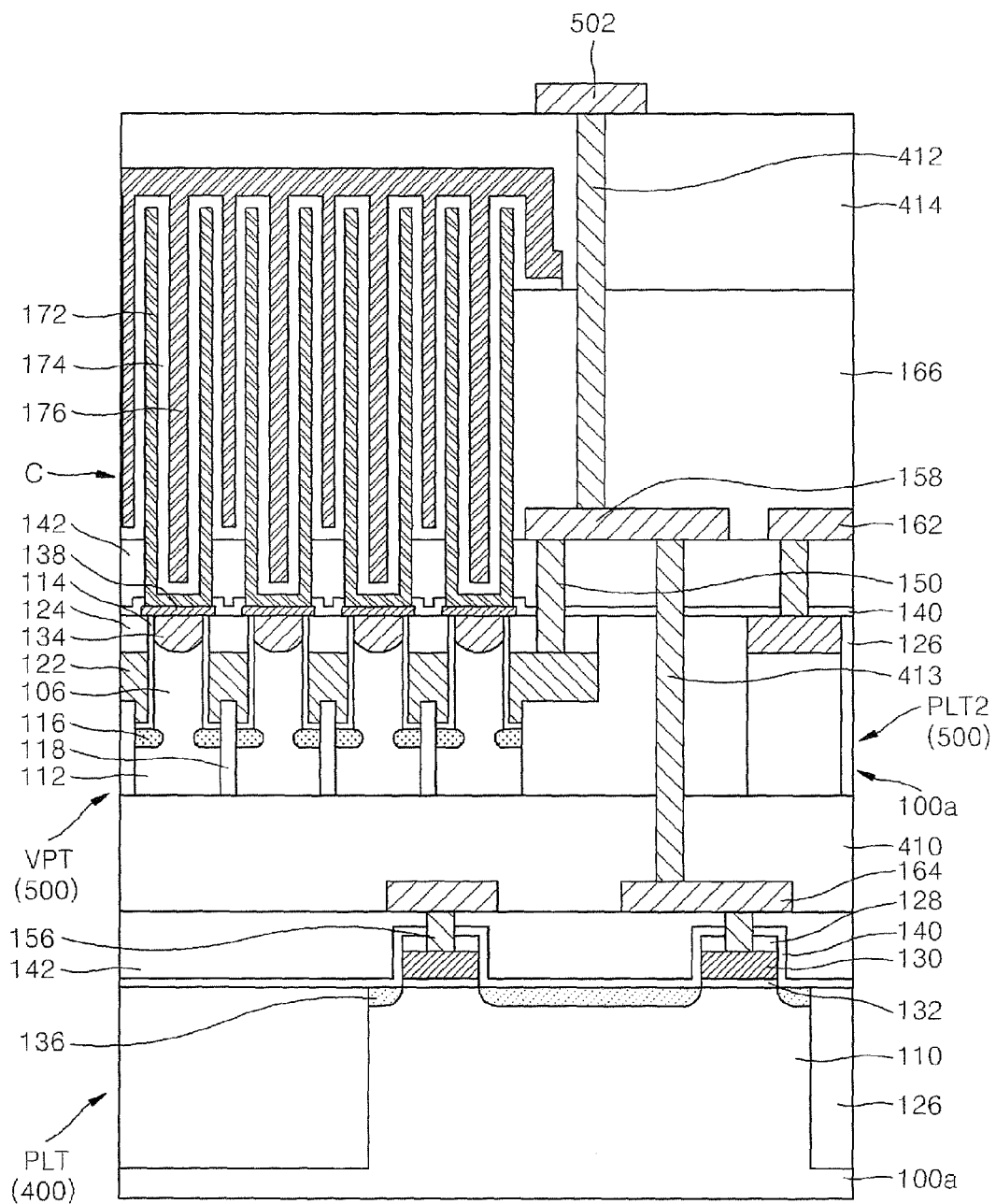
FIG. 46 is a cross-sectional view of an integrated circuit semiconductor device including stacked-level transistors according to another embodiment.

FIG. 46 is a cross-sectional view of an integrated circuit semiconductor device including stacked-level transistors according to another embodiment of the present invention.

Specifically, the integrated circuit semiconductor device according to the embodiment of FIG. 46 is identical to that of the embodiment of FIG. 44, except that a planar transistor (PLT2) is further formed at the upper substrate 100a.

In more detail, as described above, the planar transistor (PLT) is formed at the lower substrate 100. Thus, the first transistor 400 is configured with the planar transistor (PLT) at the lower substrate 100.

The vertical transistor (VPT) is formed in a first region of the upper substrate 100a bonded with the bonding insulation layer 10, and a planar transistor (PLT2) is formed in a second region of the upper substrate 100a. Thus, the second transistor 500 is configured with the vertical transistor (VPT) and the planar transistor (PLT2). The insulation layer 414 is formed on the second transistor 500. Thus, the vertical transistor (VPT) constitutes a cell array transistor, and the two planar transistors (PLT and PLT2) constitute a peripheral circuit transistor.

The word line 122 of the second transistor 500 is connected to the final interconnection layer 502 through the fifth contact 412. Interconnection relations of the first transistor 400 and the second transistor 500 are similar to those of the previous embodiments. That is, the fourth interconnection layer 164 is connected to the first interconnection layer 158 through the sixth contact hole 413, and the first interconnection layer 158 is connected to the final interconnection layer 502 through the fifth contact 412. For convenience, the word line or bit line of the first transistor 400 is connected to the final interconnection layer 502 at another location (not sown) of the lower substrate 100.

The integrated circuit semiconductor device according to the embodiment of FIG. 46 includes the vertical transistor (VPT) as the cell array transistor, the two planar transistors (PLT and PLT2) as the peripheral circuit transistor, so that the integration density can be significantly improved, and the degree of freedom in design can be increased.

Fabrication Method of Integrated Circuit Semiconductor Device Including Stacked-Level Transistors For convenience in description, a fabrication method of the integrated circuit semiconductor device according to the embodiment of FIGS. 38 and 39 will be now be described as an example. The integrated circuit semiconductor devices according to all of the previous embodiments can be applied to the following fabrication method.

Figure 47:
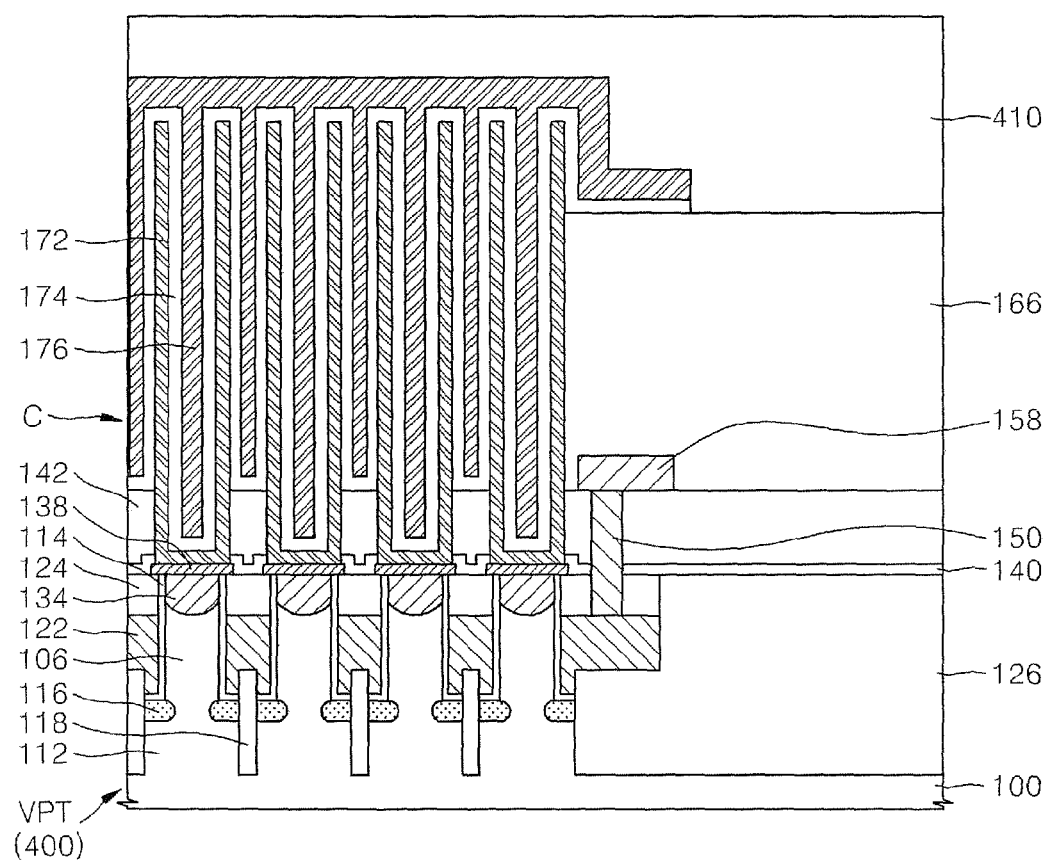
FIGS. 47 through 50 are cross-sectional views for explaining a method of fabricating an integrated circuit semiconductor device including stacked-level transistors according to the present invention.

FIGS. 47 through 50 are cross-sectional views for explaining a fabrication method of an integrated circuit semiconductor device including stacked-level transistors according to the present invention Referring to FIG. 47, a first transistor 400 configured with at least one of a vertical transistor (VPT) and a planar transistor (PLT) is formed at a lower substrate 100. A silicon substrate, i.e., a silicon wafer is used as the lower substrate 100. In FIG. 47, as described above, only the vertical transistor (VPT) is formed. Thereafter, a bonding insulation layer 410 is formed on the first transistor 400 configured with the vertical transistor (VPT). An oxide layer is used as the bonding insulation layer 410. The bonding insulation layer 410 may be formed by a thermal oxidation method or a chemical vapor deposition method. The bonding insulation layer 410 may be naturally formed when the first transistor 400 is formed at the lower substrate 100.

Figure 48:
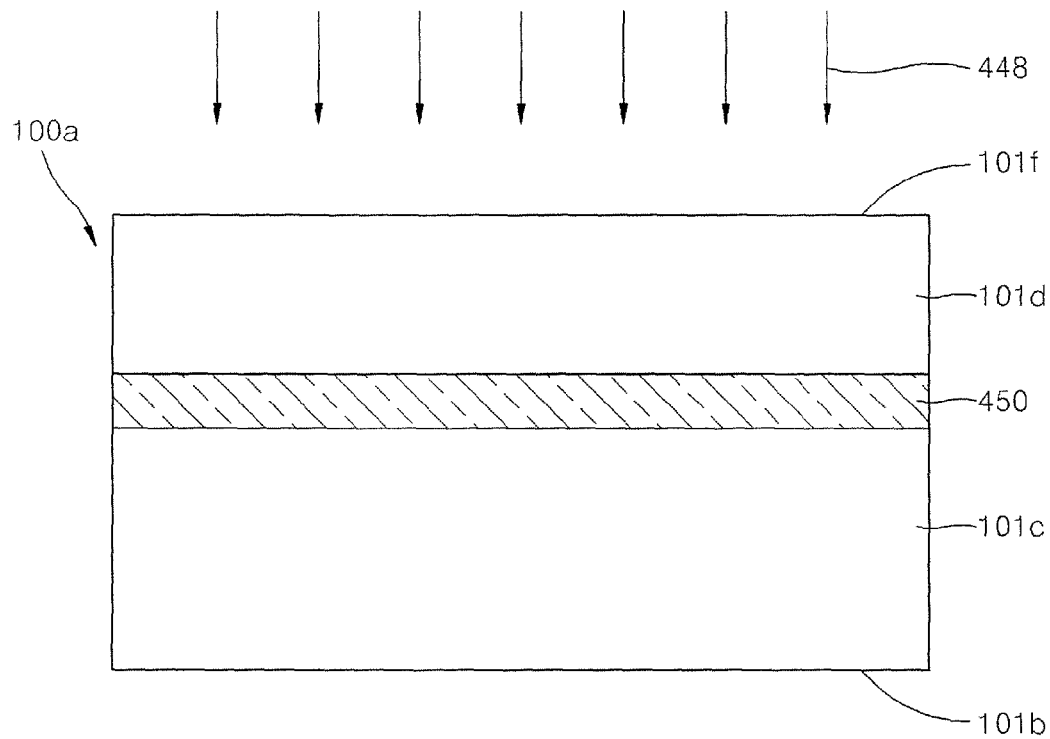

Referring to FIG. 48, an upper substrate 100a having a top side 101f and a back side 101b is prepared. A silicon substrate, i.e., a silicon wafer is used as the upper substrate 100a. Hydrogen ions 448 are implanted toward the upper side 101f of the upper substrate 100a, thereby forming a damage layer 450 within the upper substrate 100a. The upper substrate 100a is divided into an upper region 101d and a lower region 101c with reference to the damage layer 450. The implantation energy and doses of hydrogen ions being implanted are set to be sufficient to place the damage layer 450 within the upper substrate 100a. For example, in the hydrogen ion implantation, the acceleration voltage ranges from about 10 Kev to about 100 Kev, and the doses range from 1E16 cm-2 to 1E17 cm-2.

Figure 49:
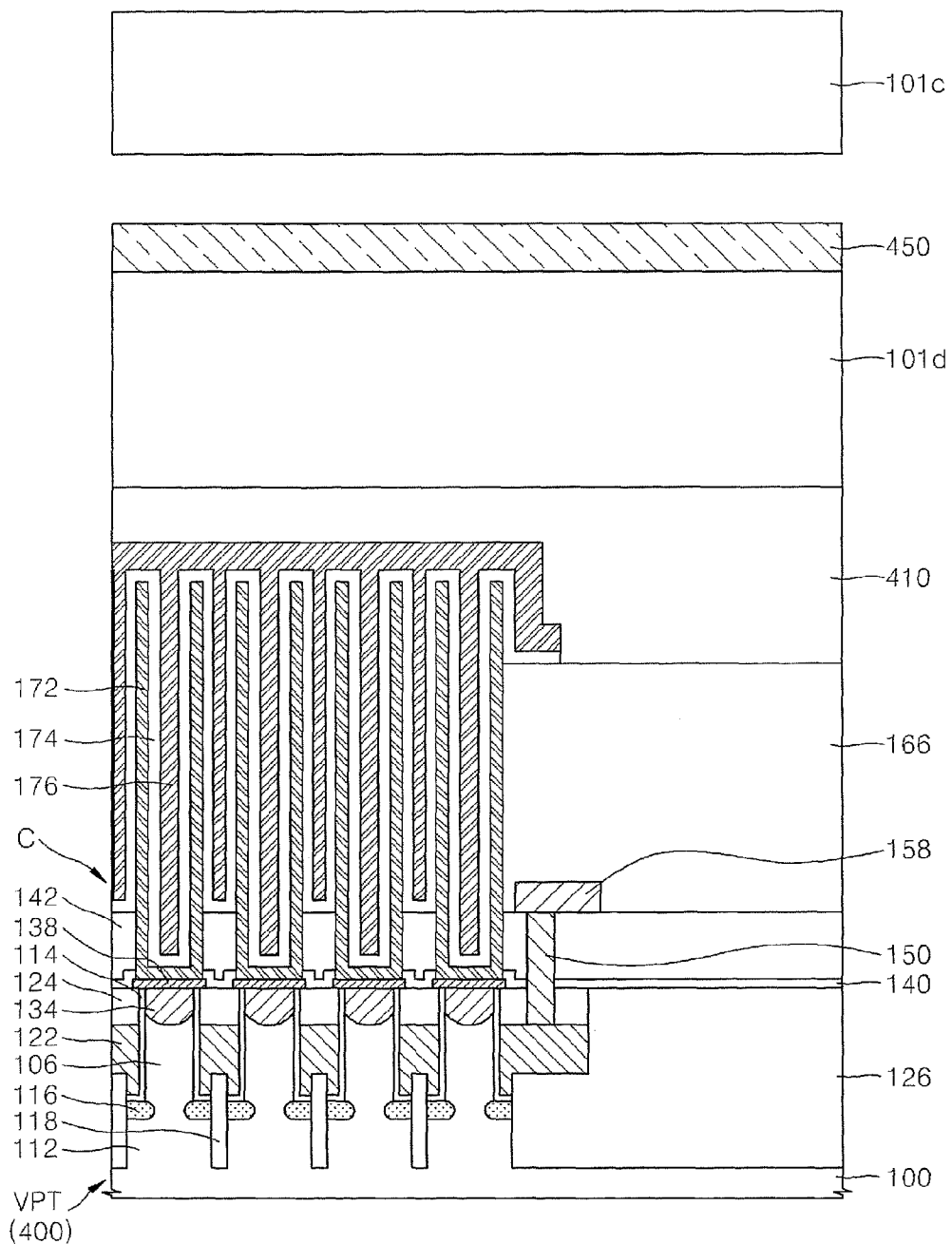

Referring to FIG. 49, the upper substrate 100a is turned over and bonded with the bonding insulation layer 410 formed on the lower substrate 100. That is, the top side 101f of the upper substrate 100a is bonded on the bonding insulation layer 410. Since the top side 101f of the upper substrate 100a is mirror-finished, it may be bonded with the bonding insulation layer 410 without an adhesive.

Then, a thermal treatment is performed on the lower substrate 100 and the upper substrate 100a bonded with the bonding insulation layer 410, thereby separating the lower region 101c of the upper substrate 100a with the damage layer 450 as a facet. The temperature of the thermal treatment for separation is 300° C. or higher, and may range from about 350° C. to about 500° C. in an oxidizing atmosphere.

Figure 50:
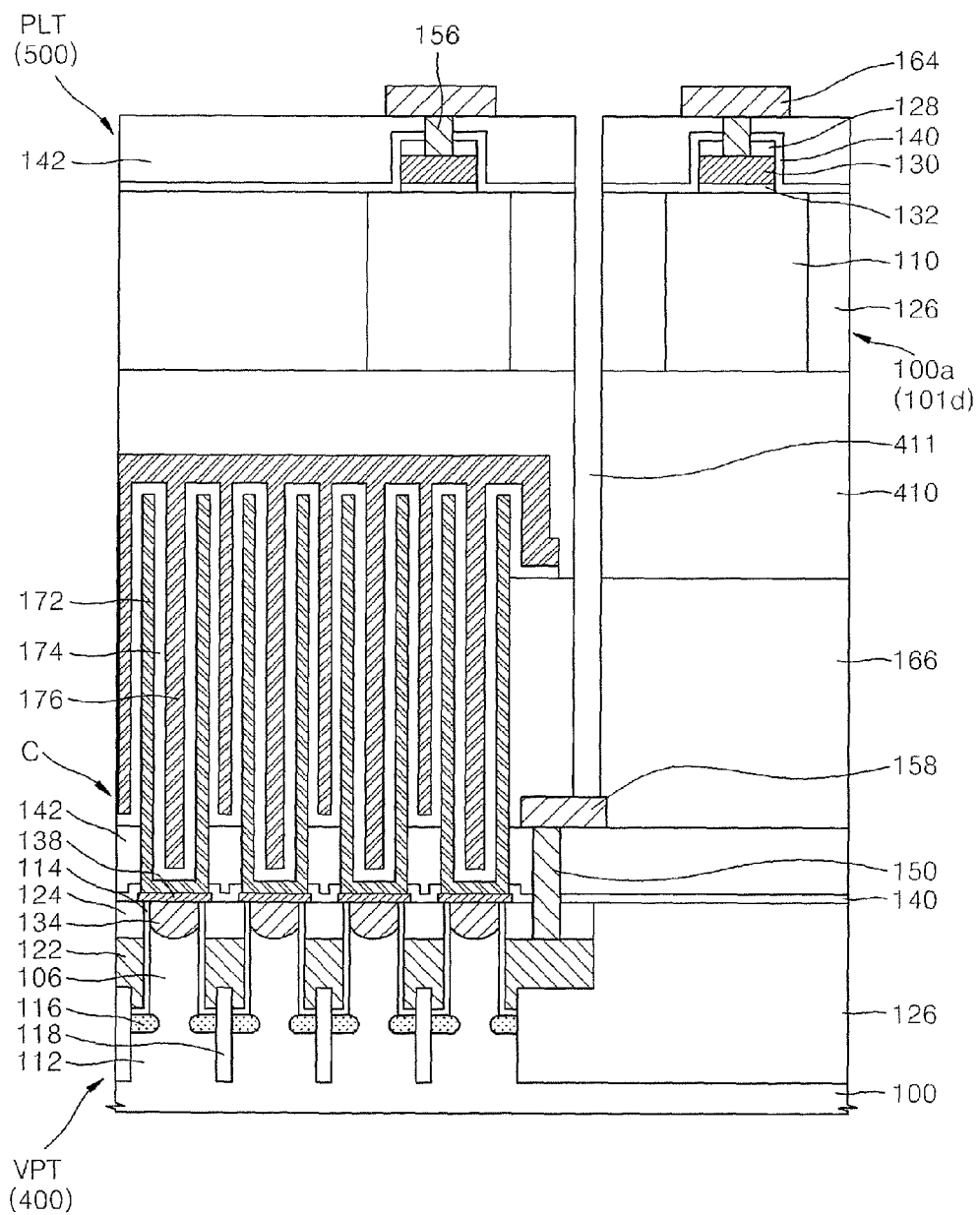

Referring to FIG. 50, chemical mechanical polishing is performed on the upper region 101d of the upper substrate 100a after the bonding. Then, a device forming region 101d in which a second transistor 500 is to be formed is completed at the upper substrate 100a. Then, the second transistor 500 configured with at least one of a vertical transistor (VPT) and a planar transistor (PLT) is formed at the upper substrate 100a. In FIG. 50, as mentioned above, only the planar transistor (VPT) is formed. The second transistor 500 is formed as if it is on a silicon on insulator (SOI) layer, so that individual transistors of the second transistor 500 have improved device isolation characteristics. Thus, the individual (unit) transistors constituting the second transistor 500 can have small sizes, and thus the size of the integrated circuit device can be reduced.

A via hole 411 is formed to connect the first transistor 400 and the second transistor 500. The via hole 411 may be connected with a word line 122 or a bit line of the first transistor 400. For convenience, only the via hole 411 that is formed on a first interconnection layer 158 connected with the word line 122 is illustrated in FIG. 50. The via hole 411 is filled with a conductive material, thereby forming a fifth contact 412 as illustrated in FIG. 38. As shown in FIG. 38, a conductive pattern is formed on the fifth contact 412, thereby forming a final interconnection layer 502 connected with the first interconnection layer 158. Consequently, the word line 122 and the bit line of the first transistor 400 are connected with the final interconnection layer 502 of the second transistor 500.

The integrated circuit semiconductor device according to the present invention includes the first transistor 400 configured with the vertical transistor (VPT) at the lower substrate 100, and the second transistor 500 configured with the planar transistor (PLT) at the upper substrate 100a. Thus, the fabrication process can be simplified as compared to the case where a vertical transistor and a planar transistor are formed at one substrate.

In other words, if the vertical and planar transistors are formed at one substrate, a fabrication process becomes very complex because a surface region of the substrate is divided into a vertical transistor forming region and a planar transistor forming region, and dual fabrication processes are performed. However, in the integrated circuit semiconductor device according to the present invention, the fabrication process is simple because the vertical transistor (VPT) is formed at the lower substrate 100, and the planar transistor (PLT) is formed at the upper substrate 100a, and then simple bonding is performed.

Figure 51:
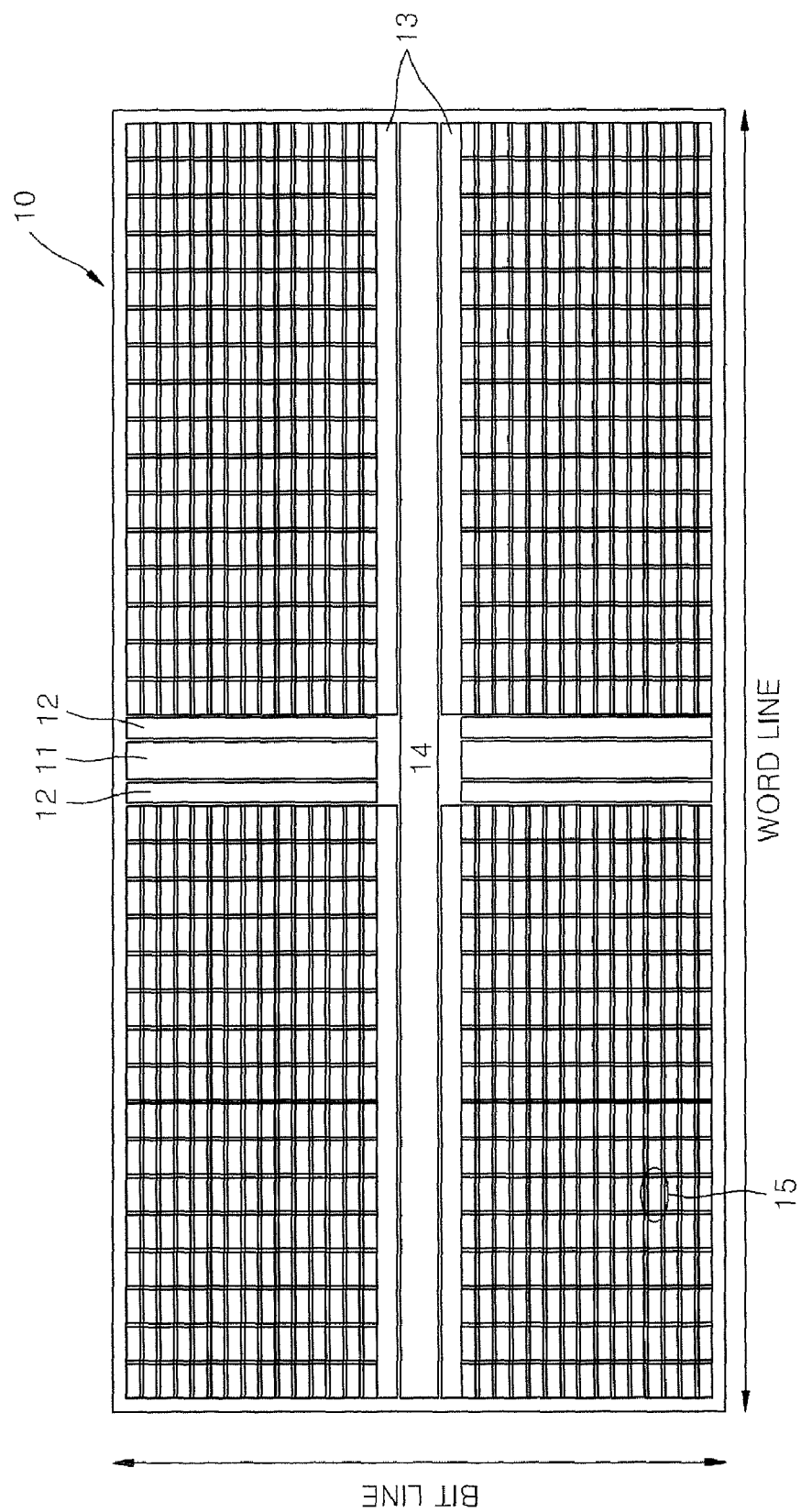
FIG. 51 is a layout illustrating an example of an integrated circuit device to which the present invention is applicable.
Figure 52:
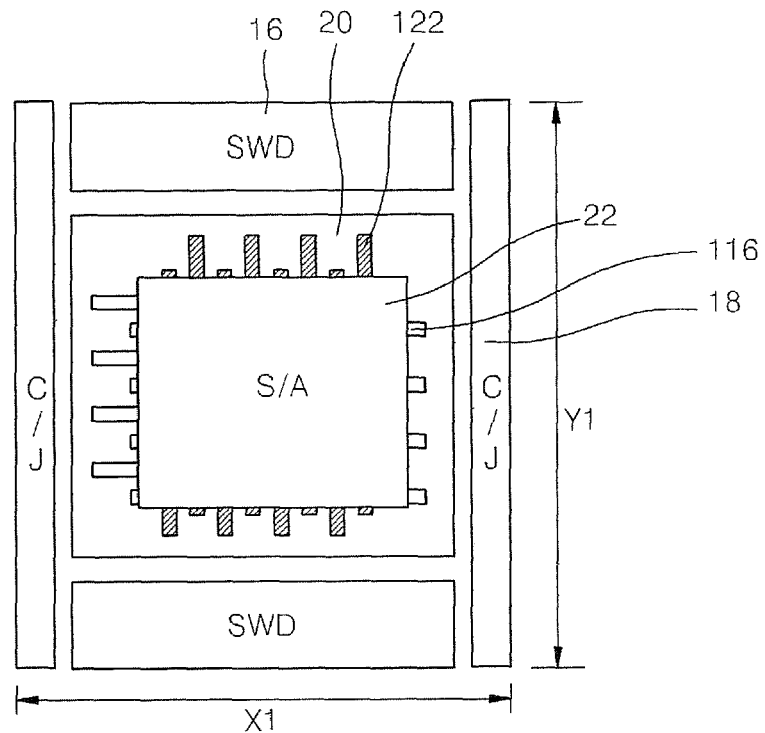
FIGS. 52 and 53 are enlarged views of a unit cell region of FIG. 51 including stacked-level transistors.
Figure 53:
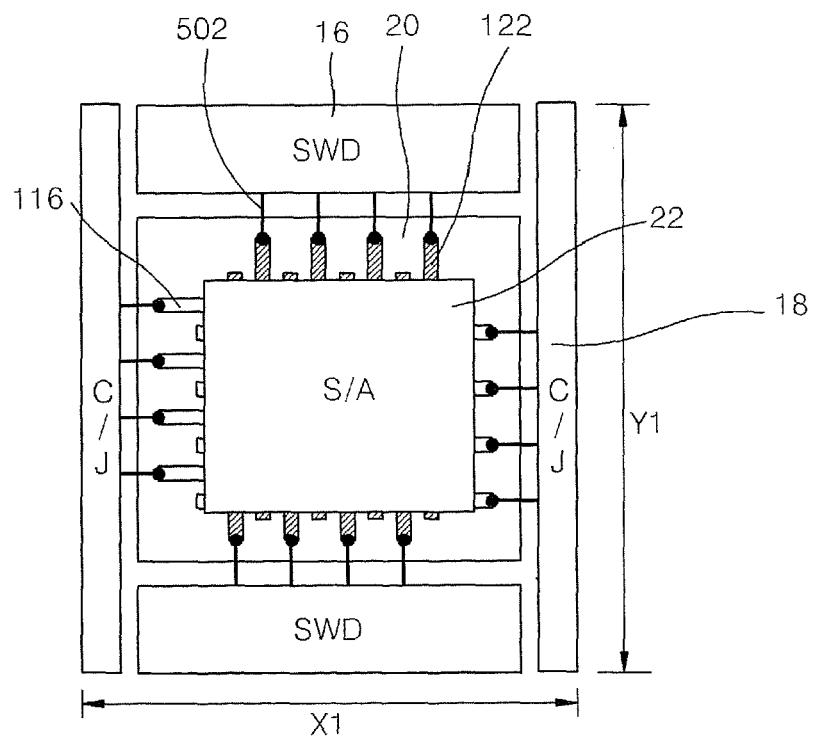
Figure 54:
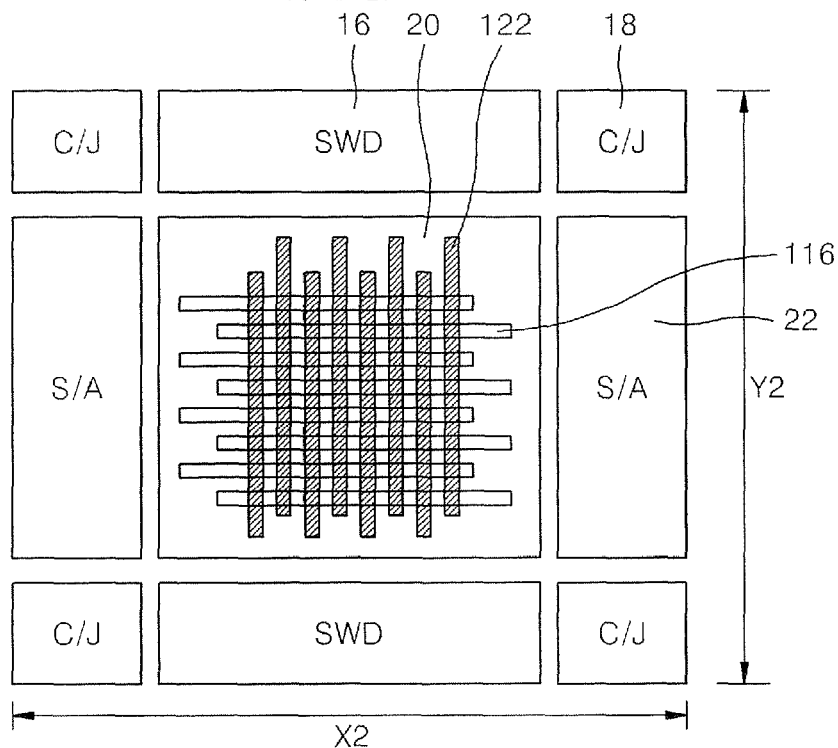
FIGS. 54 and 55 are enlarged views of a unit cell region including one-level transistors for comparison with FIGS. 52 and 53.
Figure 55:
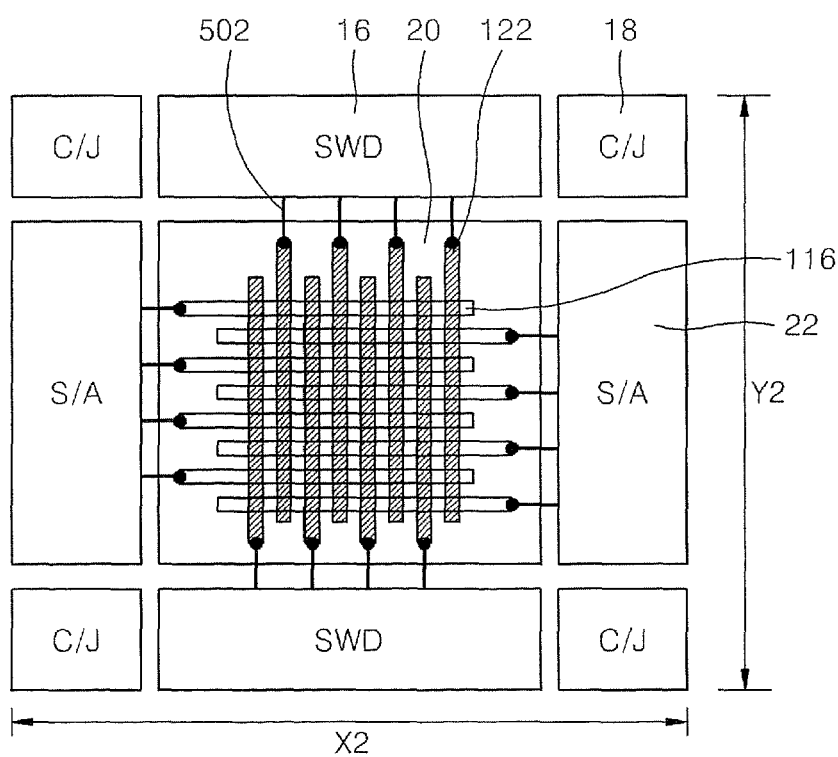

Comparison Between Integrated Circuit Semiconductor Device Including One-Level Transistors and Integrated Circuit Semiconductor Device Including Stacked-Level Transistors FIG. 51 is a layout illustrating an example of an integrated circuit device to which the present invention is applicable. FIGS. 52 and 53 are enlarged views of a unit cell region of FIG. 51, which includes stacked-level transistors. FIGS. 54 and 55 are enlarged views of a unit cell region including one-level transistors for comparison with FIGS. 52 and 53. In FIGS. 52 and 54, a final interconnection layer is not formed. In FIGS. 53 and 54, the final interconnection layer is formed.

Specifically, as shown in FIG. 51 the integrated circuit device 10, i.e., a chip according to the present invention may be divided into a main row decoder region 11, a main word line driver region 12, a color decoder region 13, a bonding pad region 14 and a unit cell region 15. All of the regions excluding the unit cell region 15 may be a peripheral circuit region.

As shown in FIGS. 52 through 55, the unit cell region 15 includes a cell array region 20 including a word line 122 and a bit line 116. As mentioned above, a plurality of cell array transistors each configured with a vertical transistor or a planar transistor are provided in the cell array region 20.

The sub-word line region (SWD) 16 and a support circuit region (C/J) 18 are placed around the cell array region 20. A sense amplifier region (SA) 22 is placed on the cell array region 20 or at both sides of the cell array region 20. In a broad sense, every part excluding the cell array region 20 may be called the peripheral circuit region. That is, in a broad sense, the main row decoder region 11, the main word line driver region 12, the column decoder region 13, the bonding pad region 14, the sub-word line region 16, the support circuit region 18 and the sense amplifier region 22 may all be the peripheral circuit region. A plurality of peripheral circuit transistors are provided in the peripheral circuit region in the broad sense.

As illustrated in FIGS. 52 and 53, the sense amplifier region 22, which is a peripheral circuit region, is stacked on the cell array region 20. Thus, a stacked-level transistor structure is provided, in which the peripheral circuit transistor, i.e., the second transistor is stacked on the cell array transistor, i.e., the first transistor. In contrast, as illustrated in FIG. 54 and 55, the peripheral circuit region is placed around the cell array region 20. That is, an one-level transistor structure is provided, in which the peripheral circuit transistor, i.e., the second transistor is placed two-dimensionally around the cell array transistor, i.e., the first transistor.

As illustrated in FIGS. 52 and 53, the integrated circuit semiconductor device according to the present invention has a stacked-level transistor structure, and thus the unit cell region 15 has an area of X1×Y1. In contrast, as illustrated in FIGS. 54 and 55, the one-level transistor structure of a comparison example has the unit cell region 15 with an area of X2×Y2, which is greater than X1×Y1. Accordingly, the integrated circuit semiconductor device according to the present invention can significantly increase the integration density as compared to the comparison example of the one-level transistor structure. Also, in the integrated circuit semiconductor device according to the present invention, the peripheral circuit region such as the sense amplifier region is placed on the cell array region, so that the degree of freedom in semiconductor-chip design can be significantly increased.

The integrated circuit semiconductor device according to the present invention includes the first transistor configured with at least one of a vertical transistor and a planar transistor as a cell array transistor or a peripheral circuit transistor on the lower substrate.

Particularly, when both of the vertical and planar transistors are formed on the lower substrate, top surfaces of the first active patterns are placed at substantially the same location as top surfaces of the second active patterns. Accordingly, the second impurity regions and the third impurity regions may be provided at substantially the same location. Thus, a pad, a capacitor or conductive patterns can be easily provided in a subsequent process.

Furthermore, in the integrated circuit semiconductor device according to the present invention, the upper substrate is bonded on the first transistor with the bonding insulating layer between. The second transistor configured with at least one of a vertical transistor and a planar transistor is stacked on the upper substrate as a cell array transistor or a peripheral circuit transistor.

Accordingly, the integrated circuit semiconductor device according to the present invention can significantly increase the integration density because the vertical transistors and the planar transistors are stacked as the cell array transistor or the peripheral transistor on the substrate.

As compared to the case where a vertical transistor and a planar transistor are formed on one substrate, the integrated circuit semiconductor device according to the present invention can be fabricated through a simple process because the vertical transistor and the planar transistor having different structures are simultaneously implemented at the lower substrate or the upper substrate.

In the integrated circuit semiconductor device according to the present invention, the bonding insulation layer is formed on the first transistor configured with at least one of the vertical transistor and the planar transistor, and then the upper substrate is bonded onto the bonding insulation layer. Thus, the second transistor is configured as if it is formed at a silicon on insulator (SOI) layer. Consequently, individual transistors of the second transistor can have improved device isolation characteristics, and thus sizes of the individual transistors can be reduced, so that the size of the integrated circuit semiconductor device can also be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit device, comprising:
   a first semiconductor substrate having at least one of a first vertical-channel transistor and a first planar-channel transistor therein, said first substrate comprising a fin-shaped active pattern extending in a first direction therein and a first plurality of spaced-apart pillar active regions on the fin-shaped active pattern that are surrounded by a first insulated gate electrode, said first plurality of spaced-apart pillar active regions comprising respective source/drain regions adjacent tops thereof;
   a bonding insulation layer on said first semiconductor substrate;
   a second semiconductor substrate having at least one of a second vertical-channel transistor and a second planar-channel transistor therein, on said bonding insulation layer; and
   an electrical interconnect electrically connected to a terminal of the at least one of a first vertical-channel transistor and a first planar-channel transistor, extending through said bonding insulation layer.

2. The integrated circuit device of claim 1, further comprising:
   a first plurality of U-shaped lower capacitor electrodes respectively connected to the source/drain regions in the first plurality of spaced-apart pillar active regions; and
   a first upper capacitor electrode on said first plurality of U-shaped lower capacitor electrodes.

3. The integrated circuit device of claim 2, wherein said bonding insulation layer extends on said first upper capacitor electrode.

4. The integrated circuit device of claim 3, wherein said second substrate comprises a second plurality of spaced-apart pillar active regions therein that are surrounded by a second insulated gate electrode; and wherein each of the second plurality of spaced-apart pillar active regions comprises a respective source/drain region adjacent a top thereof.

5. The integrated circuit device of claim 4, further comprising:
   a second plurality of U-shaped lower capacitor electrodes respectively connected to the source/drain regions in the second plurality of spaced-apart pillar active regions; and
   a second upper capacitor electrode on said second plurality of U-shaped lower capacitor electrodes.

6. An integrated circuit semiconductor device comprising:
   a first transistor formed at a lower substrate and comprising at least one of a vertical transistor and a planar transistor;
   a bonding insulation layer provided on the first transistor;
   a second transistor formed at an upper substrate bonded with the bonding insulation layer, and comprising at least one of a vertical transistor and a planar transistor; and
   an interconnection layer connecting the first transistor and the second transistor together;
   wherein the vertical transistor of the first transistor or the second transistor comprises:
   a first gate structure surrounding a side surface of a first active pattern provided at the lower substrate or the upper substrate, said first active pattern comprising a fin active pattern extending in one direction and pillar active pattern provided on the fin active pattern; and
first impurity regions provided in a surface portion of the first active pattern and under the first gate structure.

7. The device of claim 6, wherein the pillar active pattern of the first active pattern comprises an upper portion having a first width, a middle portion having a second width that is smaller than the first width, and a lower portion having a third width that is greater than the second width.

8. The device of claim 6, wherein the pillar active pattern of the first active pattern comprises an upper portion having a first width, and a lower portion having a second width that is greater than the first width.

9. The device of claim 6, further comprising a capacitor electrically connected to the first impurity region provided in the surface portion of the first active pattern.

10. The device of claim 6, further comprising a word line connected to the first gate structure and extending in a horizontal direction.

11. The device of claim 6, wherein the first gate structure comprises a first gate insulation layer pattern and a first conductive pattern.

12. The device of claim 6, wherein the planar transistor of the first transistor or the second transistor comprises:
a second gate structure provided on a second active pattern provided at the lower substrate or the upper substrate; and
second impurity regions provided in a surface portion of the second active pattern exposed by the second gate structure.

13. The device of claim 12, wherein the first active pattern and the second active pattern have top surfaces at the same height.

14. An integrated circuit semiconductor comprising:
a vertical transistor comprising a first gate structure surrounding a side surface of a first active pattern provided at a lower substrate, and first impurity regions provided in a surface portion of the first active pattern and under the first gate structure, said first active pattern comprising a fin active pattern and a pillar active pattern on the fin active pattern;
a bonding insulation layer provided on the vertical transistor;
a planar transistor comprising a second gate structure provided on a second active pattern provided at an upper substrate bonded with the bonding insulation layer, and second impurity regions provided in a surface portion of the second active pattern exposed by the second gate structure; and
an interconnection layer connecting the vertical transistor and the planar transistor together.

15. The device of claim 14, further comprising a second planar transistor comprising a third gate structure provided on a third active pattern provided at the lower substrate, and third impurity regions provided in a surface portion of the third active pattern exposed by the third gate structure.

16. The device of claim 14, further comprising a second vertical transistor comprising a third gate structure surrounding a side surface of a third active pattern provided at the upper substrate, and third impurity regions provided in a surface portion of the third active pattern and under the third gate structure.

17. An integrated circuit device, comprising:
a first substrate having a first vertical-channel transistor therein, said first vertical-channel transistor comprising:
a fin-shaped semiconductor active region extending in a first direction across said first substrate;
a plurality of spaced-apart pillar-shaped semiconductor active regions on the fin-shaped semiconductor active region;
a first insulated gate electrode surrounding said plurality of spaced-apart pillar-shaped semiconductor active regions; and
a plurality of source/drain regions adjacent in said plurality of spaced-apart pillar-shaped semiconductor active regions;
a bonding insulation layer on said first substrate; and
a second substrate having at least one of a second vertical-channel transistor and a planar-channel transistor therein, on said bonding insulating layer.

* * * * *